US010297021B2

(12) United States Patent
Minekawa et al.

(10) Patent No.: US 10,297,021 B2
(45) Date of Patent: May 21, 2019

(54) DEFECT QUANTIFICATION METHOD, DEFECT QUANTIFICATION DEVICE, AND DEFECT EVALUATION VALUE DISPLAY DEVICE

(71) Applicant: HITACHI HIGH-TECHNOLOGIES CORPORATION, Minato-ku, Tokyo (JP)

(72) Inventors: Yohei Minekawa, Tokyo (JP); Yuji Takagi, Tokyo (JP); Takehiro Hirai, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/329,480

(22) PCT Filed: Jun. 26, 2015

(86) PCT No.: PCT/JP2015/068447
§ 371 (c)(1),
(2) Date: Jan. 26, 2017

(87) PCT Pub. No.: WO2016/038982
PCT Pub. Date: Mar. 17, 2016

(65) Prior Publication Data

US 2017/0323435 A1 Nov. 9, 2017

(30) Foreign Application Priority Data

Sep. 8, 2014 (JP) ................................ 2014-181863

(51) Int. Cl.
*G06T 7/00* (2017.01)
*H01L 21/67* (2006.01)
*H01L 21/68* (2006.01)

(52) U.S. Cl.
CPC .............. *G06T 7/001* (2013.01); *H01L 21/68* (2013.01); *G06T 2207/10061* (2013.01); *G06T 2207/30148* (2013.01); *H01L 21/67288* (2013.01)

(58) Field of Classification Search
None
See application file for complete search history.

(56) References Cited

U.S. PATENT DOCUMENTS

| | | | |
|---|---|---|---|
| 8,355,562 | B2 | 1/2013 | Toyoda et al. |
| 2001/0042705 | A1 | 11/2001 | Nakagaki et al. |

(Continued)

FOREIGN PATENT DOCUMENTS

| | | | |
|---|---|---|---|
| JP | 2000-311925 | A | 11/2000 |
| JP | 2001-331784 | A | 11/2001 |

(Continued)

OTHER PUBLICATIONS

Office Action dated May 21, 2018 for Korean Patent Application No. 10-2017-7002150.

(Continued)

*Primary Examiner* — Idowu O Osifade
(74) *Attorney, Agent, or Firm* — Miles & Stockbridge P.C.

(57) ABSTRACT

To quantify the degree of a defect, and provide information useful for yield management. Disclosed is a defect quantification method wherein: a defect image is classified; a measurement region and a measurement area are set to each of the defect image and a reference image on the basis of defect image classification results, said reference image corresponding to the defect image; and an evaluation value of a defect is calculated using each of the measurement (Continued)

values obtained from each of the measurement areas of the defect image and the reference image, and the defect is quantified.

17 Claims, 15 Drawing Sheets

(56) References Cited

U.S. PATENT DOCUMENTS

| | | | | |
|---|---|---|---|---|
| 2006/0210144 | A1* | 9/2006 | Yamaguchi | G06T 7/0006 382/149 |
| 2013/0140457 | A1 | 6/2013 | Minekawa et al. | |
| 2014/0307946 | A1* | 10/2014 | Nakahira | G03F 7/7065 382/149 |
| 2016/0005157 | A1 | 1/2016 | Toyoda et al. | |
| 2016/0019682 | A1* | 1/2016 | Takagi | H01L 22/12 382/149 |

FOREIGN PATENT DOCUMENTS

| | | | |
|---|---|---|---|
| JP | 2009-071271 | A | 4/2009 |
| JP | 5202110 | B2 | 2/2013 |
| KR | 10-0775437 | B1 | 11/2007 |
| KR | 10-2012-0095429 | A | 8/2012 |
| KR | 10-2013-0092559 | A | 8/2013 |
| WO | 2012/015973 | A2 | 2/2012 |
| WO | 2014/129307 | A1 | 8/2014 |

OTHER PUBLICATIONS

Office Action dated Nov. 27, 2018 for corresponding Korean Application No. 10-2017-7002150.

* cited by examiner

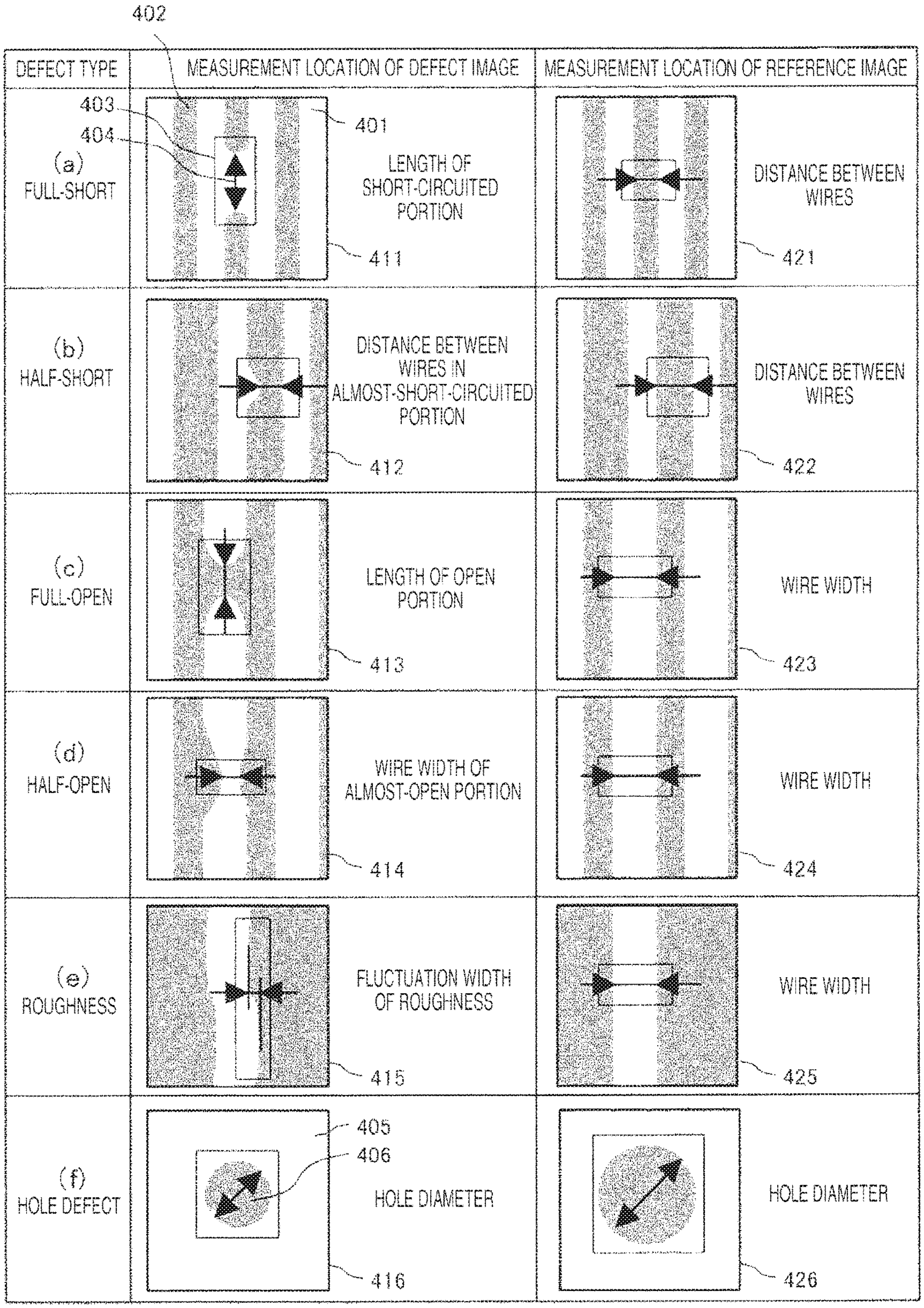

FIG.4

| DEFECT TYPE | MEASUREMENT LOCATION OF DEFECT IMAGE | | MEASUREMENT LOCATION OF REFERENCE IMAGE | |
|---|---|---|---|---|
| (a) FULL-SHORT | (image 411) | LENGTH OF SHORT-CIRCUITED PORTION | (image 421) | DISTANCE BETWEEN WIRES |
| (b) HALF-SHORT | (image 412) | DISTANCE BETWEEN WIRES IN ALMOST-SHORT-CIRCUITED PORTION | (image 422) | DISTANCE BETWEEN WIRES |
| (c) FULL-OPEN | (image 413) | LENGTH OF OPEN PORTION | (image 423) | WIRE WIDTH |
| (d) HALF-OPEN | (image 414) | WIRE WIDTH OF ALMOST-OPEN PORTION | (image 424) | WIRE WIDTH |
| (e) ROUGHNESS | (image 415) | FLUCTUATION WIDTH OF ROUGHNESS | (image 425) | WIRE WIDTH |
| (f) HOLE DEFECT | (image 416) | HOLE DIAMETER | (image 426) | HOLE DIAMETER |

DEFECT QUANTIFICATION METHOD, DEFECT QUANTIFICATION DEVICE, AND DEFECT EVALUATION VALUE DISPLAY DEVICE

TECHNICAL FIELD

The present invention relates to a method and a device for quantifying a defect on a semiconductor wafer of which image is captured with a defect inspection device, and a device for displaying an evaluation value obtained through quantification.

BACKGROUND ART

In production process of a semiconductor product, it is important to detect a reduction in the yield at an earlier point in time and perform yield management using an analysis technique for analyzing a change in the yield in order to ensure a high product yield. Various kinds of defects that occur in the production process are detected through the yield management at an earlier point in time, and countermeasures are taken. In normal circumstances, this is performed in the following three steps. (1) A semiconductor wafer is inspected with a wafer external appearance inspection device, a wafer foreign object inspection device, or the like, and the positions of a defect that occurred and a foreign object attached are detected. (2) A defect observation of the detected defect is performed, and the defect is classified on the basis of the external appearance of the defect. In this defect observation work, normally, a defect observation device having a scanning electron microscope (SEM) and the like for observing a defect portion with a high magnification rate. (3) A countermeasure is taken for each reason on the basis of the classification result.

In a case where the number of defects detected by the inspection device is extremely large, the defect observation work of (2) requires a vast amount of labor, and therefore, a defect observation device having an automatic defect review (ADR) function for automatically capturing and collecting images of defect portions and an automatic defect classification (ADC) function for automatically classifying the collected images has been developed.

There exists Patent Literature 1 as a method for performing measurement by changing a measurement region and a measurement direction.

There exists Patent Literature 2 as a method obtaining a measurement value from an SEM image and design information.

There exists Patent Literature 3 as an example of a classification method of a defect.

CITATION LIST

Patent Literature

PATENT LITERATURE 1: Japanese Patent Laid-Open No. 2000-311925

PATENT LITERATURE 2: Japanese Patent No. 5202110

PATENT LITERATURE 3: Japanese Patent Laid-Open No. 2001-331784

SUMMARY OF INVENTION

Technical Problem

As a method for performing measurement by changing a measurement region and a measurement direction, Patent Literature 1 discloses an evaluation method of photoresist application failure of a semiconductor wafer. Patent Literature 1 indicates that measurement regions are set in a radial form by making use of a fact that a target defect region is in a radial form from the center of the wafer, and a measurement value is obtained. However, in this method, measurement regions and directions specialized in photoresist application failure are designated, and it is impossible to perform measurements supporting various types of defects.

As another method, Patent Literature 2 discloses a method for detecting a pattern abnormality part from an SEM image and a design information, performing defect classification in the detected pattern abnormality part, setting a measurement location in the pattern abnormality part, and obtaining a measurement value. However, in this method, the measurement is not performed on the basis of a result of defect classification, and an appropriate measurement location cannot be set on the basis of the defect type.

In this case, the inventors et al. have found a new utilization method of a measurement result in which, when a countermeasure is taken for a defect, not only the classification result is derived, but also an evaluation value obtained by quantifying the degree of the defect is calculated, so that a more detailed countermeasure can be taken.

For example, in a short defect, an evaluation value indicating the degree how much the short defect is close to a complete short-circuit is presented to the user so as to allow the user to determine the degree how much the situation affects the product. As a result, something like the degree of closeness of the distance between wires, which cannot be determined in a conventional classification based on only whether it is a short circuit or not, can be evaluated, and data that can be used for various kinds of objects, e.g., whether it affects the lifetime of the product, can be obtained. Likewise, something like the degree of the reduction of the width of a wire, which cannot be determined in a conventional classification based on only whether a wire is broken nor not, can be evaluated, and data that can be used for various kinds of objects, e.g., whether it affects the lifetime of the product, can be obtained.

Further, monitoring of a situation of occurrence of a critical defect, prediction of the number of acquisition of conforming chips (yield prediction) based on a monitor result, and the like can be performed, One of the problems to be solved by the present invention is to provide a technique capable of setting a measurement location on the basis of a defect type. Another problem to be solved by the present invention is to provide a defect quantification method, a defect quantification device, and a defect evaluation value display device capable of quantifying the degree of the defect in association with various defects.

Solution to Problem

An example for solving the above problem is as follows.

A defect image is classified, and a measurement region and a measurement location are set for each of a defect image and a reference image corresponding to the defect image on the basis of a defect image classification result, and an evaluation value of the defect is calculated by using each measurement value obtained from measurement locations of the defect image and the reference image, and a defect is quantified.

Further configurations and effects of the present invention will be understood from the disclosure of the entire specification as follows.

Advantageous Effects of Invention

According to the present invention, a defect measurement according to the type of the defect can be performed for various defect types, and information useful for yield management can be provided by a defect evaluation value based on this measurement value.

BRIEF DESCRIPTION OF DRAWINGS

FIG. 4 is an explanatory diagram illustrating an example of measurement locations of defect images and reference images for each defect type according to an embodiment of the present invention.

DESCRIPTION OF EMBODIMENTS

Figure 1:
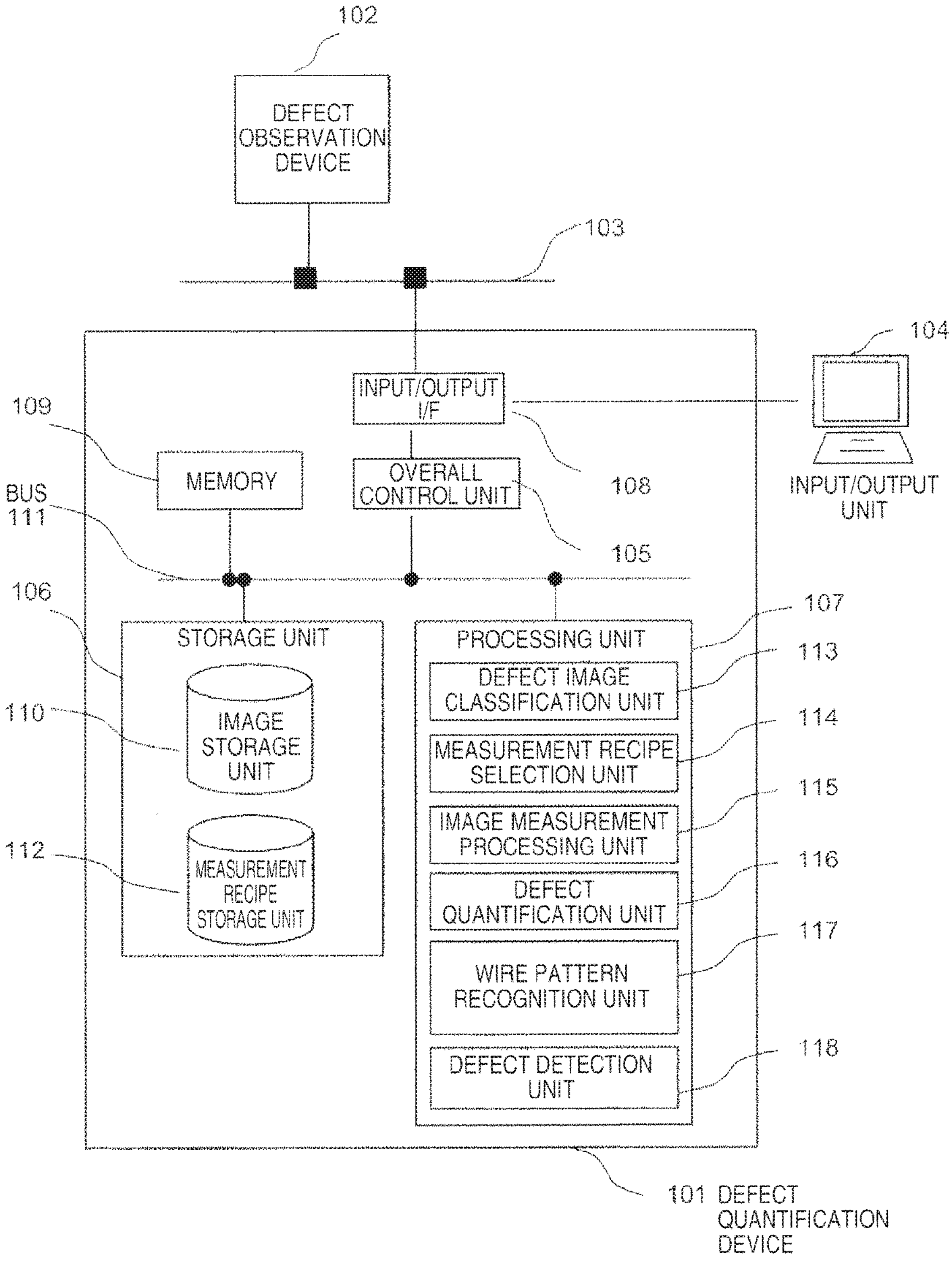
FIG. 1 is a configuration diagram illustrating a defect quantification device according to an embodiment of the present invention.

The present invention relates to a defect quantification method for quantifying various kinds of defects on a semiconductor wafer, and a device therefor, and also relates to a defect evaluation value display device for displaying an evaluation value of a defect obtained with this defect quantification method and device.

Hereinafter, embodiments of the present invention will be explained in details with reference to drawings. Throughout all of the drawings for explaining the embodiments, the same members are basically denoted with the same reference numerals, and repeated explanation thereabout is omitted. In the present embodiment, a method for quantifying a defect using a defect image captured with a defect observation device having an SEM will be explained, but an input to a defect quantification method and a device thereof according to the present invention may be those other than an SEM image, and the method and the device may use a defect image captured with optical means, an ion microscope, and the like.

Defect observation of a semiconductor wafer is targeted on various kinds of defects such as a short, an open, and the like. For this reason, in quantification of a defect, a portion to be measured is also different according to the type of defect, and it is necessary to set a measurement location by switching a measurement region, a measurement target, a measurement direction, a measurement method for each defect. For example, in a half short c which adjacent wires are almost short-circuited, in order to evaluate the degree of short-circuit, it is necessary to evaluate the distance between wires which has become narrower due to a defect and a normal inter-wire distance in which there is no defect, and therefore in a half open defect in which wires are almost broken, in order to evaluate the degree of open, it is necessary to evaluate a wire width which has become narrower due to a defect and a normal wire width in which there is no defect. Information about the measurement region, the measurement target, the measurement direction, the measurement method, and the like, or a file having information thereabout will be hereinafter referred to as a measurement recipe in the present invention.

First Embodiment

FIG. 1 is a configuration diagram illustrating a first embodiment of the present invention.

A defect quantification device 101 is connected to a defect observation device 102 observing a defect on a semiconductor wafer via communication means 103. The defect observation device 102 is a device for obtaining an image of a defect portion. The details of the defect observation device 102 will be explained later with reference to FIG. 2. An image of a defect obtained by the defect observation device 102 is transmitted via the communication means 103 to the defect quantification device 101. The defect quantification device 101 classifies the received defect image in accordance with the type of defect, and calculates a quantitative value about the defect, and the defect quantification device 101 has a function of displaying, on the input/output unit 104, the obtained classification result, an evaluation value, calculated on the basis of the defect quantitative value, related information used for evaluation value calculation, and the defect image. The input/output unit 104 is constituted by a keyboard, a mouse, a display device, and the like for presenting data to an operator and receiving an input from the operator.

The details of this defect quantification device 101 will be explained. The defect quantification device 101 includes an overall control unit 105 for controlling operation of the device, a storage unit 106 for storing images received from the defect observation device 102 and measurement recipes required for measuring the images, a processing unit 107 for performing measurement recipe operation, image measurement processing, evaluation value calculation, and the like required for defect quantification, an input/output unit 104, an input/output I/F unit 108 for data transfer via the communication means 103, a memory 109, for storing programs, image information, and the like, and a bus 111 for performing data communication between the storage unit 106, the processing unit 107, the memory 109, the overall control unit 105, and the input/output I/F 108.

The storage unit 106 includes an image storage unit 110 storing a defect image and a reference image captured by the defect observation device 102 and a measurement recipe storage unit 112 for storing measurement region information that is set for the images captured by the defect observation device 102 and a measurement recipe including information about the target measurement method. The processing unit 107 includes a defect image classification unit 113 for classifying a defect image captured by the defect observation device 102 for each type of defect, a measurement recipe selection unit 114 for selecting a measurement recipe stored in the measurement recipe storage unit 112 on the basis of a classification result, an image measurement processing unit 115 for setting a measurement region in a defect image and a reference image on the basis of the selected measurement recipe and performing measurement processing of the measurement target on the image, a defect quantification unit 116 for calculating an evaluation value of defect from the measurement value, a wire pattern recognition unit 117 for recognizing a wire pattern from an image captured by the defect observation device, and a defect detection unit 118 for detecting a defect region from a defect image. It should be noted that the details of the processing performed by the processing unit will be explained later.

Figure 2:
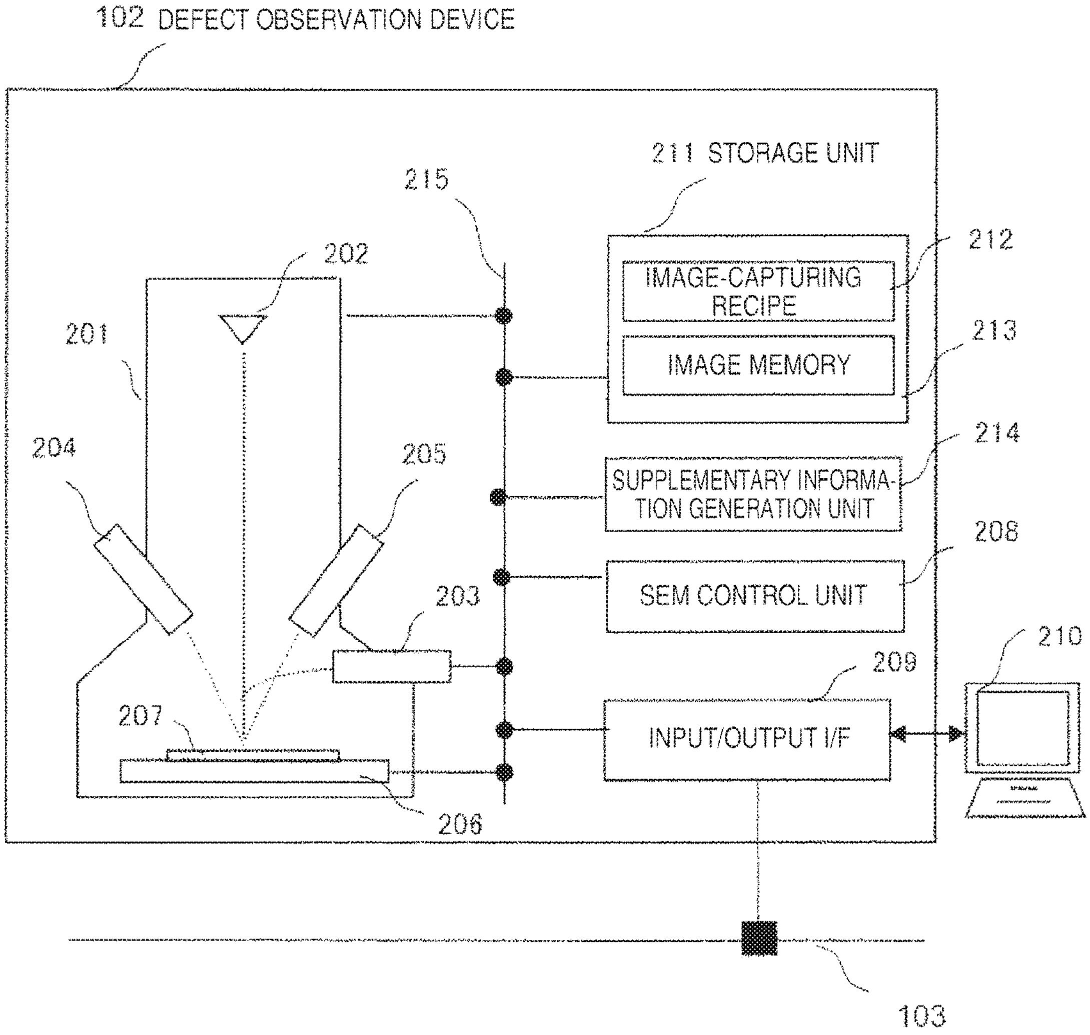
FIG. 2 is a configuration diagram illustrating a defect observation device according to an embodiment of the present invention.

FIG. 2 is a configuration diagram illustrating a defect observation device 102. The defect observation device 102 is configured so that an SEM column 201, an SEM control unit 208, an input/output I/F 209, a storage unit 211, and a supplementary information generation unit 214 are connected via communication means 215. The input/output I/F 209 is connected to the input/output unit 210, and performs input/output of data to and from the operator.

The SEM column 201 includes an electron source 202, a sample wafer 207, and a stage 206 on which the sample wafer 207 is placed, and multiple detection devices 203, 204, 205 for detecting secondary electrons and backscattering electrons which are generated as a result of an emission of a primary electron beam to the sample wafer 207 from the electron source 202. In addition, the SEM column 201 includes a deflection device not shown) for scanning a primary electron beam on an observation region of the sample wafer 207, an image generation unit (not shown) for generating a digital image by converting the strength of the detected electron into digital, and the like. An image obtained by detecting the secondary electrons with the detection device 203 will be referred to as an SE image, and an image obtained by detecting the backscattering electrons with the detection devices 204 and 205 will be referred to as an L image and an R image.

The storage unit 211 includes an image-capturing recipe storage unit 212 storing a coordinate of a defect, of which image is to be captured, on the wafer and SEM image-capturing conditions (acceleration voltage, probe current, the number of added frames, visual field size, and the like) and an image memory 213 saving obtained image data.

The supplementary information generation unit 214 has a function of generating information supplementing each piece of image data, e.g., image-capturing conditions such as an acceleration voltage, a probe current, the number of added frames, and the like during image-capturing process, ID information for identifying an image-capturing device, a type and a property of the detection devices 203 to 205 used for image generation, an ID and process of a wafer, and information such as the date and the time at which an image is captured. Information about the ID and process of the wafer may be input by the user with the input/output unit 210 and the like, or may be read from the surface of the wafer or read from a box (not shown) in which the wafer is stored. When image data is transferred via the input/output I/F 209, the generated supplementary information and the image data is transferred at a time.

The SEM control unit 208 is a unit for controlling al the processing performed with the defect observation device 102 such as image acquisition. In accordance with a control from the SEM control unit 208, the defect observation device 102 performs movement of the stage 206 for moving a predetermined observation portion on the sample wafer 207 into an image-capturing visual field, emission of a primary electron beam onto the sample wafer 207, detection of electrons generated from the sample with the detection devices 203 to 205, imaging of detected electrons, saving the image to the image memory 213, generation of supplementary information for the captured image with the supplementary information generation unit 214, and the like. Various kinds of commands given by the operator, designations of image-capturing conditions, and the like are given by using the input/output unit 210 constituted by a keyboard, a mouse, a display, and the like.

Figure 3:
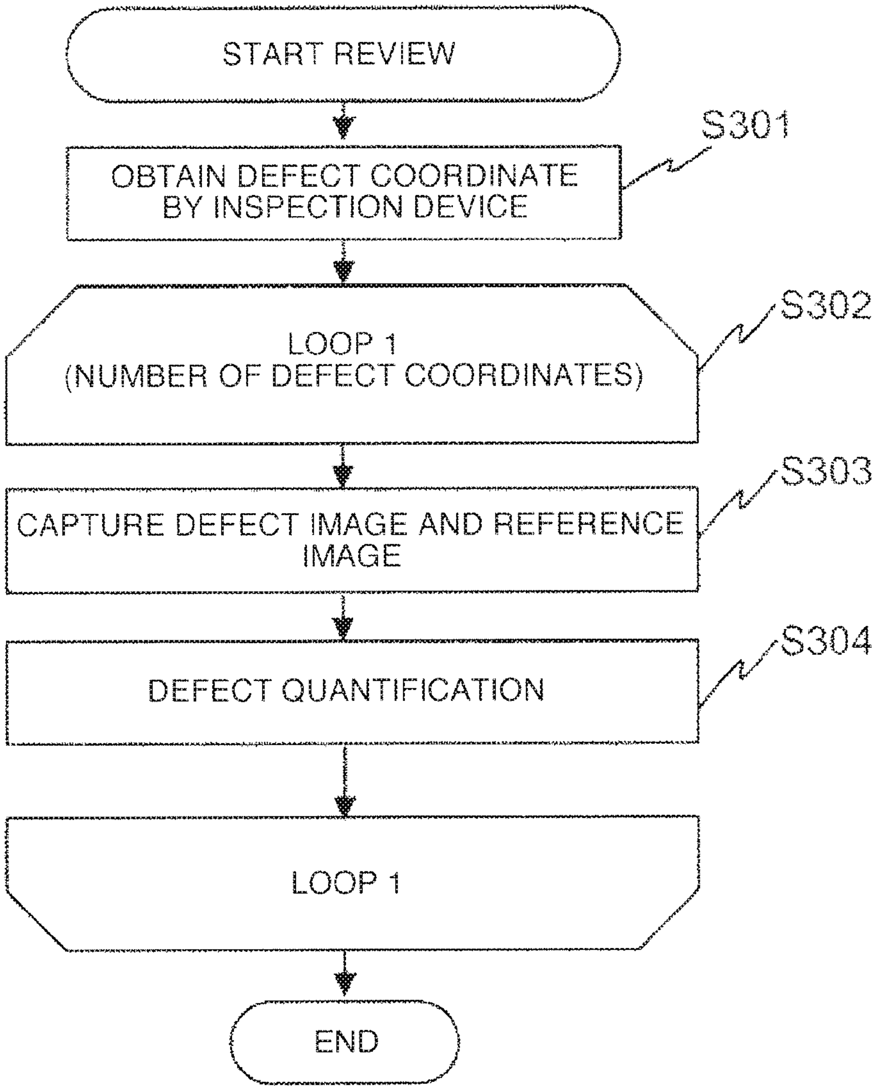
FIG. 3 is a flow diagram illustrating a procedure of a defect observation according to an embodiment of the present invention.

Hereinafter, a method of a defect observation according to the presentation will be explained with reference to FIG. 3. FIG. 3 illustrates a flow of defect observation including defect quantification according to the present invention.

First, defect position information (defect coordinate) obtained with an inspection device such as a wafer external appearance inspection device or a wafer foreign object inspection device is obtained (S301). The defect coordinate may be saved to an image-capturing recipe stored in the image-capturing recipe storage unit 212.

Subsequently, a defect image and a reference image corresponding to each defect coordinate are captured with the defect observation device 102 (S303), and the defect quantification device 101 performs defect quantification in the defect image and the reference image, and calculates an evaluation value (S304). The processing in S303 to S304 is repeated for the number of defect coordinates (i.e., the number of defects). The details about the defect quantification processing S304 will be explained later.

The defect image is a SEM image including a defect portion detected with the inspection device, and the reference image means a conforming image that does not include any defect portion in which the same pattern as the wire pattern of the defect image is captured. A semiconductor has such a feature that the same wire pattern is generated for each die, and therefore, the reference image may be captured at a position corresponding to the defect coordinate on a die adjacent to the die having the defect. A reference image may be generated by masking a defect portion of a defect image and combining the mask region with an image of a peripheral region. In a case where there is design information of a wire pattern corresponding to the defect coordinate, a reference image may be generated through simulation from the design information.

Hereinafter, the quantification processing S304 of the defect will be explained with reference to FIGS. 4, 5. In the quantification of the defect disclosed in the present embodiment, not only the measurement value of the defect portion obtained from the defect image but also the measurement value obtained from the reference image are used as a reference of comparison. For example, in a case where the adjacent wire patterns are almost shorted even though they are not actually shorted, the minimum distance between the adjacent wire patterns and the inter-wire distance in the reference image are measured, and the measurement values thereof are compared, so that a defect can be evaluated by quantifying the degree how much the distance between the wires is narrowed as compared to the normal case. In the quantification of the defect, the method of the quantification differs according to the defect type, and the measurement region setting method in the defect image and the reference image, the definition of the measurement location, and the calculation method of the quantitative value are different.

FIG. 4 collectively illustrates measurement regions and measurement locations of the defect image and the reference image for each defect type. A defect type (a) indicates an example of a full-short where adjacent wire patterns are completely shorted. A defect type (b) indicates an example of a half-short where adjacent wire patterns are almost shorted. A defect type (c) indicates an example of a full-open where wire patterns are completely cut off. A defect type (d) indicates an example of a half-open where wire patterns are almost cut off and the width is narrowed. A defect type (e) indicates an example of a roughness where fluctuation of a wire width occurs. A defect type (f) indicates an example of a hole defect where a hole diameter is reduced. The hole defect also includes a case where the hole diameter is expanded, but it is not shown in this case.

Reference symbols 411 to 416 denote examples of defect images corresponding to each defect type. Reference symbols 421 to 426 denote examples of reference images corresponding to 411 to 416. Reference symbols 411 to 415, 421 to 425 denote examples where a wire pattern 401 is formed on a base 402. The defect images 412 to 415 and the reference images 421 to 425 are also shown in the same manner, and more specifically, a wire pattern 401 is indicated in a bright manner and a base 402 is indicated in a dark manner although reference symbols are not given. The defect image 416 is an example where a hole 406 is formed in an upper layer 405, and although a reference symbol is not attached, the corresponding reference image 426 is also shown in the same manner, and more specifically, an upper layer 405 is indicated in a bright manner and a hole 406 is indicated in a dark manner. The defect types (a) to (d) of FIG. 4 are referred to as pattern defects.

The image 411 illustrates an example of a measurement region 403 including a measurement target and a measurement location 404. Reference symbol 404 indicates that the measurement location is defined by a distance between both ends of an arrow. The indications of the measurement locations in reference symbols 412 to 416, 421 to 426 are also given in a similar manner.

Hereinafter, an example of calculation of the measurement region, the measurement location, and the defect evaluation value for each defect type will be explained. It should be noted that the example of calculation shown here shows an example of calculation in which, e.g., when the defect evaluation value is higher, it is a defect which it is necessary to pay attention to, for example, the criticality of the product is higher, or it is a defect that greatly affects the yield.

(a) Full-Short:

When a short defect occurs over a larger range between adjacent wires, it is a defect which it is necessary to pay attention to. In order to express this, the shortest distance of the shorted portion shown in the defect image 411 (the measurement value of the defect image) and the inter-wire distance in the reference image 121 (the measurement value of the reference image) are measured, and an evaluation value obtained by normalizing it with the inter-wire distance according to the following defect evaluation value calculation expression is calculated.

$$\text{evaluation value}=\text{measurement value of defect image}/\text{measurement value of reference image} \quad \text{(Expression 1)}$$

(b) Half Short:

When the distance between the wires is narrower, it is a defect which it is necessary to pay attention to, even though it is not a full-short. In order to express this, the shortest distance between wires in a portion that is almost short-circuited shown in the defect image 412 (the measurement value of the defect image) and the inter-wire distance in the reference image 422 (the measurement value of the reference image) are measured, and an evaluation value obtained by normalizing it with the inter-wire distance according to the following defect evaluation value calculation expression is calculated.

$$\text{evaluation value}=1.0-\text{measurement value of defect image}/\text{measurement value of reference image} \quad \text{(Expression 2)}$$

(c) Full-Open:

When an open defect has a larger break in the wire, it is a defect which it is necessary to pay attention to. In order to express this, the shortest distance in an open portion shown in the defect image 413 (the measurement value of the defect image) and the wire width in the reference image 423 (the measurement value of the reference image) are measured, and an evaluation value is calculated with the defect evaluation value calculation expression in Expression (1).

(d) Half Open:

When the wire width is narrower even though it is not completely open, it is a defect which it is necessary to pay attention to. In order to express this, the wire minimum width of a portion that is almost open shown in the defect image 414 (the measurement value of the defect image) and the wire width in the reference image 424 (the measurement value of the reference image) are measured, and an evaluation value is calculated with the defect evaluation value calculation expression in Expression (2).

(e) Roughness:

When the fluctuation of the wire width due to roughness is larger, the degree of attention is higher. In order to express this, the maximum width of the fluctuation of the roughness shown in the defect image 415 (the measurement value of the defect image) and the wire width in the reference image 425 (the measurement value of the reference image) are measured, and an evaluation value is calculated with the defect evaluation value calculation expression in Expression (1).

(f) Hole Defect:

When the hole diameter of the defect image is more greatly different from the hole diameter of the reference image in the hole defect, it is a defect which it is necessary to pay attention to. In order to express this, the hole diameter obtained from the defect image 416 (the measurement value of the defect image) and the hole diameter obtained from the reference image 426 (the measurement value of the reference image) are measured, and an evaluation value is calculated with the following defect evaluation value calculation expression.

evaluation value=1 measurement value of defect image−measurement value of reference image 1/measurement value of reference image (Expression 3)

In the above explanation, although an example of the defect types (a) to (f) has been explained, the present invention can also be applied to other defect types. For example, a foreign object can be classified in accordance with how a wire is short-circuited due to the foreign object in a similar manner to (a) full-short, (b) half short, and the evaluation value can be calculated by using a calculation expression of the measurement method and evaluation value similar thereto.

The examples of the measurement regions and the measurement location of FIG. 4 are examples, and the user sets and registers a measurement recipe for each defect type, so that a measurement location intended by the user can be set on the basis of the measurement recipe that is different for each defect type.

Figure 10:
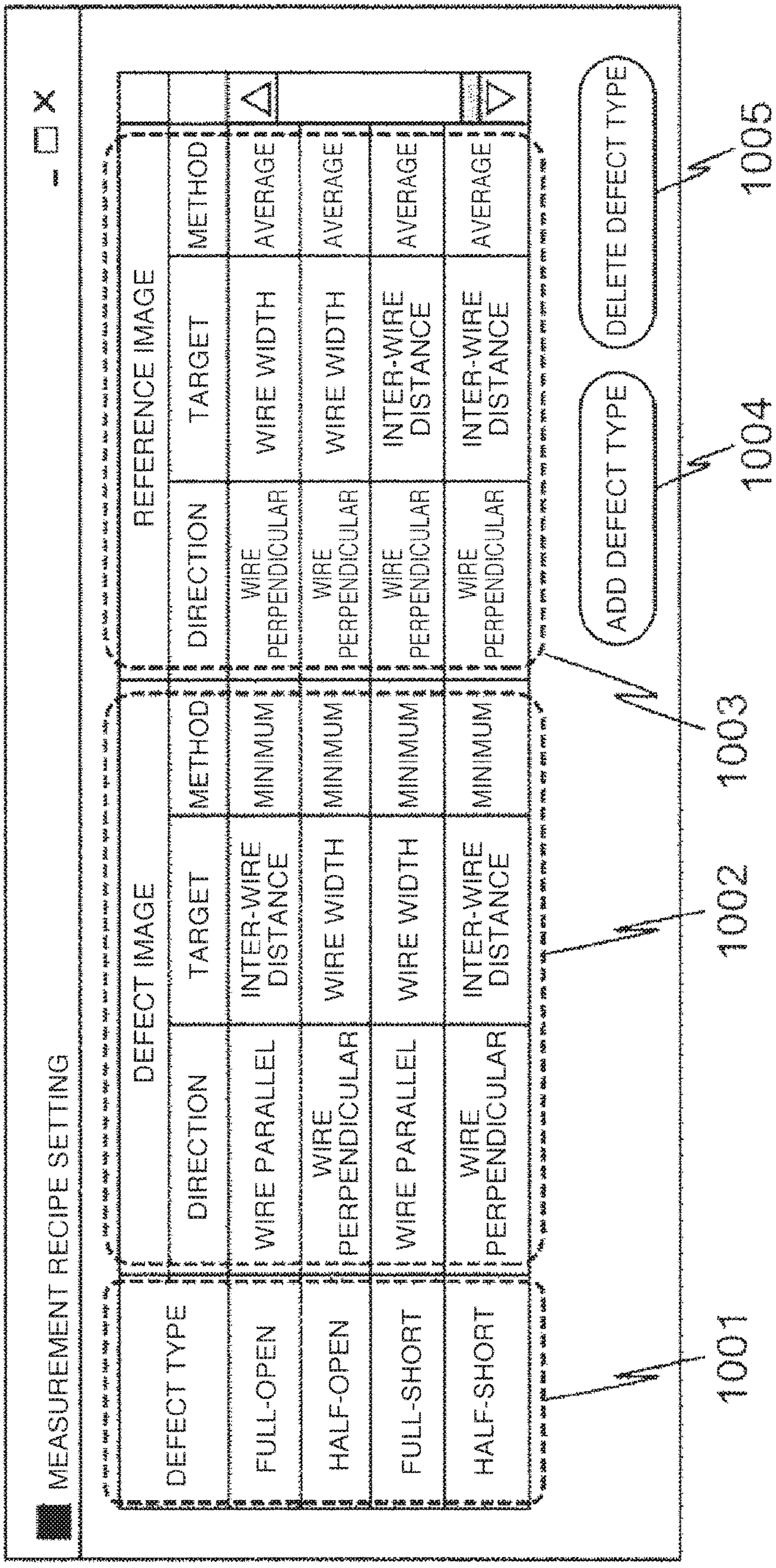
FIG. 10 is a figure illustrating an example of a screen input and an output display for setting a measurement recipe for each defect type according to an embodiment of the present invention.

The setting method of the measurement recipe will be explained later with reference to FIG. 10. The details of the measurement location setting with the measurement recipe will be explained later with reference to FIG. 8.

FIG. 4 shows the example where a single portion is measured each of the defer image and the reference image, but the measurement region and the measurement location are not limited to a single portion. Alternatively, multiple locations may be set, and an evaluation value may be calculated from multiple measurement values by using arithmetic calculation and weighted addition. There may be multiple evaluation values to be calculated, and the measurement values may be output as evaluation values without any calculation. Even in a case where the measurement values may be output as evaluation values without any calculation, it will be referred to as calculation of the evaluation values in the explanation.

Figure 5:
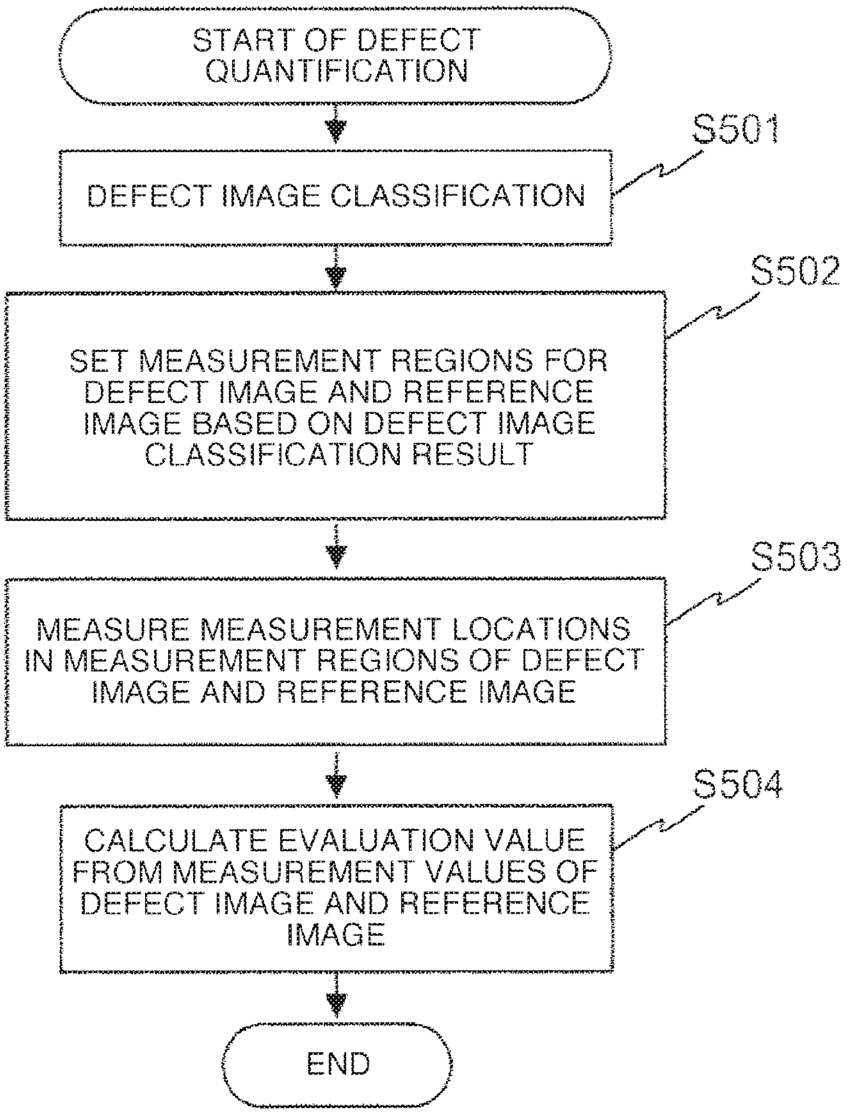
FIG. 5 is a flow diagram illustrating a procedure of defect quantification processing according to an embodiment of the present invention.

FIG. 5 is a detailed flow of the defect quantification processing S304. In the defect quantification, first, the defect classification unit 113 classifies images in accordance with the defect type such as full-short, half short, and the like (S501). Subsequently, the measurement recipe selection unit 114 reads a measurement recipe corresponding to the classification result from the measurement recipe storage unit 112, and the image measurement processing unit 115 sets the measurement region for each of the defect image and the reference image on the basis of the measurement region information described in the measurement recipe (S502). Subsequently, the measurement location designated in the measurement recipe is measured in the measurement region of the defect image and the reference image (S503). A specific processing method in S501 to S503 will be explained later. Finally, the evaluation value is calculated from the measurement value (S504). The calculation expression of the evaluation value is performed by using the expression designated in the measurement recipe. S503 and S504 are executed by the defect quantification unit 116, In a case where a SEM image captured from an adjacent die and the like as the reference image is used in the quantification processing of S304, this allows comparison with the measurement value of the conforming pattern produced through an actual process, and therefore, there is an advantage in that an evaluation value more precisely based on the reality can be calculated as compared with the case where a value of a wire width and a wire distance obtained from the design information is used. In a case where the reference image is composed from a defect image or in a case where the reference image is generated from design information, it is not necessary to individually capture the reference image, and therefore, there is an advantage in that the image-capturing throughput per defect is improved.

Figure 6:
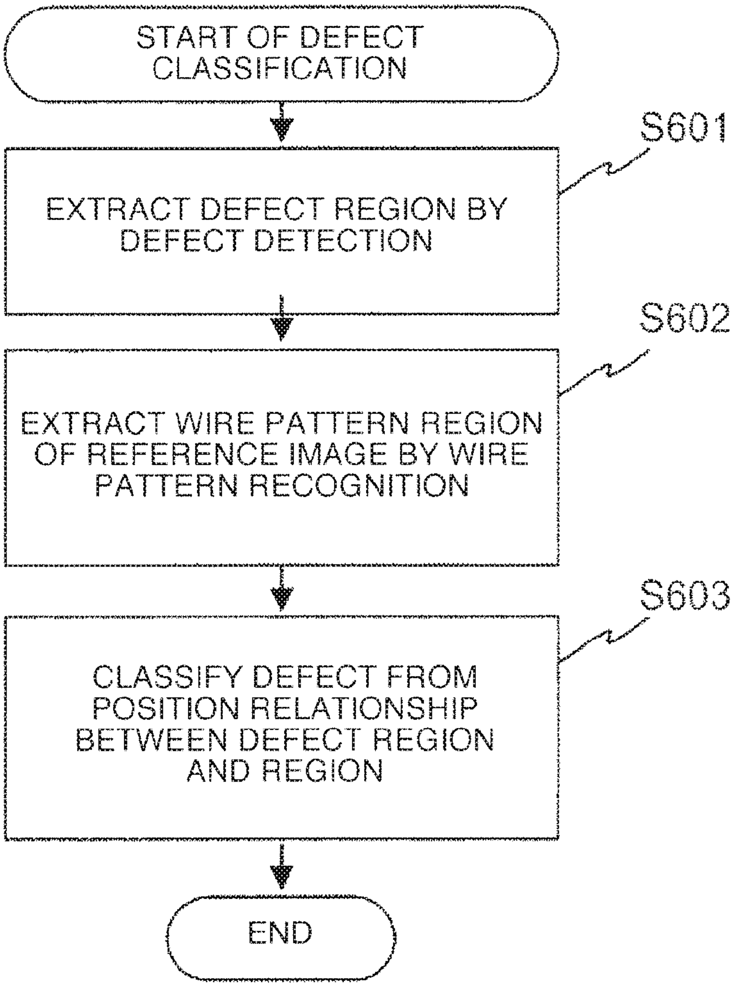
FIG. 6 is a flow diagram illustrating an example of a procedure of pattern defect classification processing according to an embodiment of the present invention.
Figure 7:
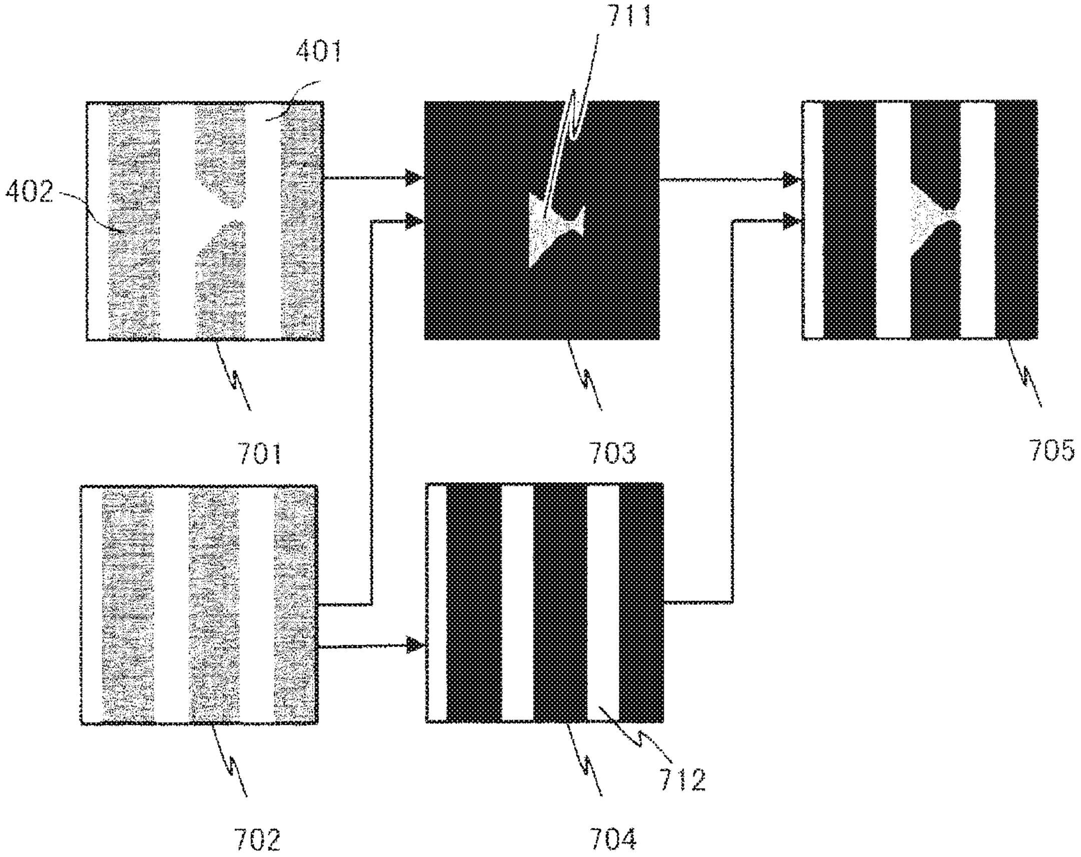
FIG. 7 is an explanatory diagram illustrating an example of an intermediate result of pattern defect classification processing according to an embodiment of the present invention.

The defect image classification processing (S501) will be explained with reference to FIG. 6 and FIG. 7. FIG. 6 is a flowchart illustrating defect image classification processing for a pattern defect. FIG. 7 schematically illustrates the steps of processing of an image in the flowchart of FIG. 6.

First, in the defect detection processing, a defect region is extracted from the defect image (S601). In a specific processing example of the defect detection processing, a differential image is generated from a difference in grayscale at each pixel between the defect image and the reference image, and a location having a large absolute value of the grayscale value in the differential image, or a large positive or negative value thereof may be extracted as the defect region. In order to extract a region from a grayscale image, Otsu binarization and the like may be used as the binarization method of the grayscale value. In a case where the position of the wire pattern differs between the defect image and the reference image, the position of the wire pattern may be adjusted between the defect image and the reference image by using Normalized Cross Correlation and the like, and thereafter, the differential image may be generated. In FIG. 7, a defect image 701 is an example of a full-short defect, and 702 denotes a corresponding reference image. In the example of FIG. 7, when the defect detection processing is executed, a defect detection image 703 is obtained, and a defect region 711 is extracted.

Subsequently, the wire pattern recognition processing is performed on the reference image, and a wire pattern region is extracted (S602). The wire pattern recognition processing may be performed with a generally-available region dividing technique of images. For example, in a case where the grayscale value of the wire pattern region is high, and the grayscale value of the base is low, the wire pattern region is extracted by using a binarization technique such as Otsu binarization. Alternatively, edge detection filter processing such as sobel filter may be performed, and a wire edge may be detected by binarizing the processing image, so that the image may be divided into regions by using the edges, and a wire pattern region may be extracted. A wire pattern recognition image 704 of FIG. 7 denotes a wire pattern recognition result in a reference image 702 and a wire pattern region 712 is extracted.

Finally, the pattern defect is classified from a position relationship between the defect region and the wire pattern region obtained in S601 and S602 (S603). In this classification, the defect region and the wire pattern region are overlaid, and in a case where the defect region is on the wire pattern region, it can be determined to be an open defect, and in a case where the defect region is outside of the wire pattern region, it can be determined to be a short defect. In this case, the position relationship of the regions means whether or not the defect region is on the wire pattern region or outside of the wire pattern region. In order to determine whether the defect region is on the wire region or outside of the wire region, summations of the number of pixels in the defect region overlapping the wire pattern region and the number of pixels in the defect region not overlapping the wire pattern region are calculated, and a comparison is performed, and in a case where the number of pixels in the defect region overlapping the wire pattern region is higher, the defect region may be determined to be inside of the wire pattern region, and in a case where the number of pixels in the defect region not overlapping the wire pattern region is higher, the defect region may be determined to be outside of the wire pattern region, In a case of an open defect, the defect region may be classified into a full-open when the defect region completely covers the wire pattern region, and the defect region may be classified into a half-open when the defect region does not completely cover the wire pattern region. In this case, the position relationship of the regions means whether or not the defect region completely covers the wire pattern region. In order to determine whether or not the defect region completely covers the wire pattern region, for example, a rectangle circumscribing the defect region (circumscribing rectangle) is calculated, and when the edges of both ends of the wire pattern region are included in the circumscribing rectangle, the defect region can be determined to completely include the wire pattern region. The edge may be detected by applying an edge detection filter such as sobel filter to the wire pattern recognition result and performing the binarization.

In a case of short defect, the defect region can be classified into a full-short when independent wire regions are connected by the defect region, and the defect region can be classified into a half-short when independent wire regions are not connected by the defect region. In this case, the position relationship of the regions means whether independent wire regions are connected by the defect region or not. In order to determine whether the defect region connects the wire regions or not, for example, a rectangle circumscribing the defect region may be calculated, and a determination may be made as to whether both edges of an adjacent wire pattern region are included in the circumscribing rectangle. In a case where both edges are included, the defect region can be determined to completely extend over both of the wires. Reference symbol 705 of FIG. 7 illustrates a figure displaying a defect region 711 and a wire pattern region 712 in an overlapping manner, and the defect region can be classified into a full-short defect since the defect region is outside of the wire pattern region and completely extends over wires. The rules of the classifications may be registered in advance by the user.

In this case, the method for classifying a pattern defect from a position relationship between a defect region and a wire pattern region has been explained. Alternatively, a classification may be performed in accordance with a technique for calculating a feature quantity such as circularity, brightness dispersion, and the like of a defect from a defect image and a reference image and classifying the pattern defect on the basis of machine learning from the feature quantity, described in Patent Literature 3. In the classification based on the machine learning using the feature quantity, the classification can be performed with those other than the pattern defects.

An operation of the defect image classification processing explained above performed on a device will be explained with reference to FIG. 1. The defect image and the reference image captured by the defect observation device 102 are transmitted via the communication means 103 to the defect quantification device 101, and the transmitted images are read via the input/output OF 108 to the defect quantification device 101. The read images are transferred by the overall control unit 105 to the defect detection unit 118, and the defect detection unit 118 executes the defect detection processing. The read reference images are transferred by the overall control unit 105 to the wire pattern recognition unit 117, and the wire pattern recognition unit 117 executes the wire pattern recognition processing. The defect detection image obtained by the defect detection unit 118 and the wire pattern recognition image obtained by the wire pattern recognition unit 117 are sent by the overall control unit 105 to the defect classification unit 113, which executes the defect image classification processing. The classification result is stored in the memory 109.

Figure 8:
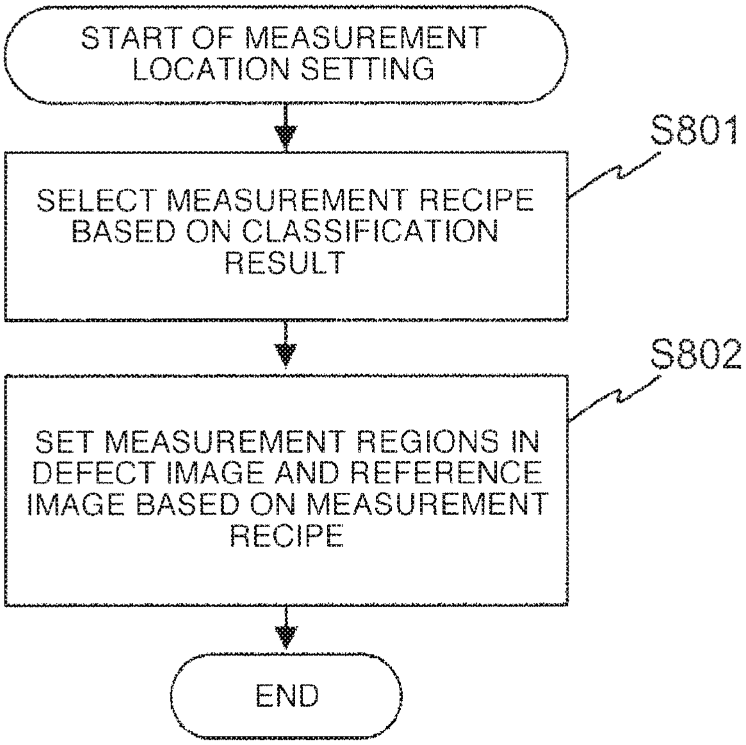
FIG. 8 is a flow diagram illustrating a procedure of measurement location setting processing according to an embodiment of the present invention.

Subsequently, the processing S502 for setting a measurement region on the basis of a classification result will be explained with reference to FIG. 8. FIG. 8 illustrates a processing flow of S502. First, a measurement recipe prepared in advance for each classification type is selected on the basis of the classification result (S801). In this case, the measurement recipe is information for designating measurement regions in a defect image and a reference image and the measurement location of a measurement target, and includes information about a definition of a measurement location such as, for example, a relative position of the measurement region with respect to the wire pattern on the defect region and the reference image, a measurement direction for a measurement target (e.g., whether it is in the vertical direction or the horizontal direction with respect to the wire pattern), a measurement target (wire width or inter-wire distance), a measurement method (the shortest distance, the average distance, and the like of the measurement target in the measurement region), and the like. The measurement direction may be designated as the horizontal direction and the vertical direction in the defect image and the reference image, or may be designated as a diagonal direction by using a combination of the vertical and horizontal directions. The measurement recipe is set by the user in advance, and stored in the measurement recipe storage unit 112. The setting method of the measurement recipe will be explained later with reference to FIG. 10. Subsequently, the measurement region is set in the defect image and the reference image on the basis of the measurement recipe selected in S801 (S802).

An operation of the measurement region setting processing explained above performed on a device will be explained with reference to FIG. 1. The measurement recipe selection unit 114 reads, from the measurement recipe storage unit 112, a measurement recipe corresponding to the classification result stored in the memory 109, and sends the measurement recipe to the image measurement processing unit 115. The image measurement processing unit 115 converts position information about the measurement region into a coordinate on the defect image and the reference image on the basis of the selected measurement recipe.

Figure 9:
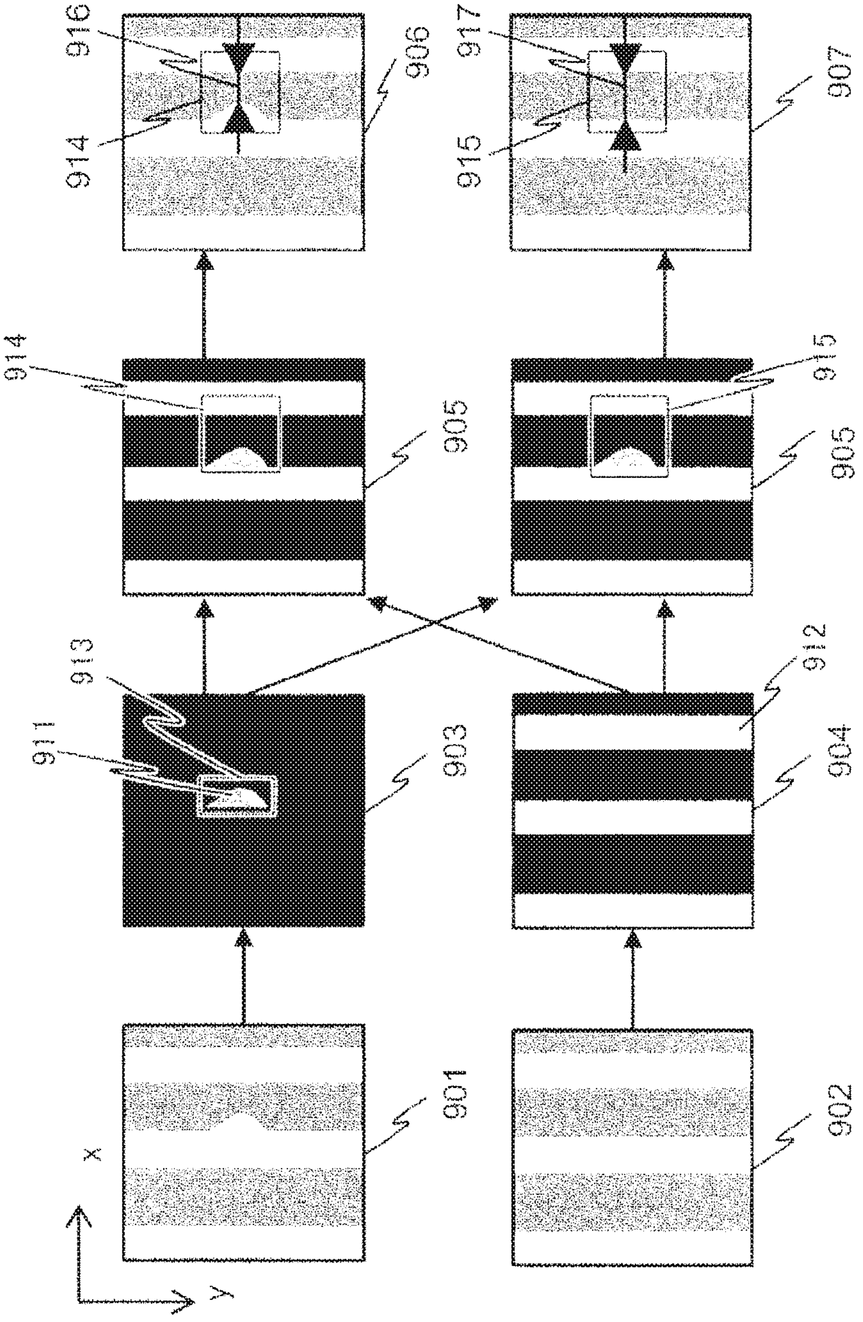
FIG. 9 is an explanatory diagram illustrating an example of intermediate images of processing for setting a measurement region and measurement location in a defect image and a reference image on the basis of a measurement recipe according to an embodiment of the present invention.

The details of S802 and S503 performed subsequent to S802 will be explained with reference to FIG. 9. FIG. 9 illustrates, using images, intermediate processing states in S802 and S503 in a case of a half short defect, for example. S802 and S503 are executed for each of the defect image and the reference image.

The measurement region is determined from information about the measurement direction, the measurement target, and the measurement portion of the measurement recipe, and the defect region and the wire pattern region obtained from the image processing. For example, an image 901 of a half short defect of FIG. 9 and a corresponding reference image 902 is used for the explanation. A defect detection result 903 and a wire pattern recognition result 904 are obtained in accordance with the above method from the defect image 901 and the reference image 902. As illustrated in FIG. 4, in a case of a half short, the measurement location in the defect image is an inter-wire distance of an almost-shorted portion, and the measurement location in the reference image is an inter-wire distance. The short-circuit occurs with an adjacent wire, and therefore, the measurement direction in the defect image is a direction perpendicular to the wire (x direction in FIG. 9), the measurement target is an inter-wire distance, and the measurement portion may be set to a location where the inter-wire distance is the shortest.

It should be noted that the wire direction can be determined by deriving a direction of a wire edge in accordance with a technique such as Hough transform from the edge detection result of the wire pattern region 904 in the reference image. The image 905 is an image obtained by superimposing the defect region and the pattern region, and reference numeral 914 denotes a measurement region 914 of the defect. The measurement region 914 is set to include the measurement location. In a case of 905, the edge of the defect and the edge of the adjacent wire pattern are the measurement location. The measurement region 914 may be set to a region obtained by stretching a rectangle 913 circumscribing the defect region 911 in the measurement direction (x direction) so as to be deformed to include a wire pattern region edge portion at the side opposite to the defect region which is the measurement location. In FIG. 9, for the sake of explanation, the circumscribing rectangle 913 is shown in a region slightly larger than the rectangle circumscribing the defect region 911.

An image 906 showing the measurement step of S503 indicates a result in which a measurement location 916 is set from the measurement region 914, and the measurement location is indicated with an arrow like FIG. 4. In order to obtain the measurement value on the basis of the measurement location, for example, in each y coordinate in the measurement region 914, the measurement direction (x direction) is scanned, and the location where the defect region 911 and the wire pattern region 912 are closest is extracted, and a combination of coordinates may be adopted as the measurement location.

As illustrated in FIG. 4, the measurement direction in the reference image 902 of FIG. 9 may be set to a wire vertical direction (x direction), the measurement target may be set to an inter-wire distance, and the measurement portion may be set to an average distance between wires. When the measurement portion is the average in the measurement region, the influence of the noise can be reduced in a pattern having a simple shape such as a line pattern. A measurement region 915 is a measurement region for the reference image. The rectangle 913 circumscribing the defect region of the defect image is stretched in the measurement direction, and a measurement region is set on the reference image so as to include the portion between the wires which is the measurement target. More specifically, the reference image is scanned in the measurement direction (x direction) by using the center coordinate of the defect region of the defect image, and the measurement region may be stretched until the edge of the wire pattern region 912 is found. An image 907 indicating the measurement step of S503 in the reference image shows, with an arrow, a result in which the measurement location 917 is set from the measurement region 915. In order to obtain the measurement value on the basis of the measurement location, for example, in each y coordinate in the measurement region 915, the measurement direction (x direction) is scanned, and the distance between the right and the left wire pattern regions 912 within the measurement region 915 may be measured. In the image 917, a measurement value is shown as the distance between the two points, but the average of the distance between the wires that can be measured in the measurement region 915 may be used. For the measurement region in the reference image, the same region as that in the defect image may be used.

As another method of the measurement processing S503, the measurement region that has been set may be used with the technique described in Patent Literature 2.

By making use of the fact that the grayscale value increases at the wire pattern edge portion, the end of the defect portion, and the like which are to be set in the SEM image, one-dimensional waveform (grayscale profile) of the grayscale value in the measurement direction on the image is obtained, and a highly accurate measurement value is calculated from the grayscale profile. A grayscale profile in the measurement direction that has been set is obtained in the measurement region, and the threshold value is calculated from the maximum value and the minimum value of the grayscale value in a portion of the grayscale profile where there is a grayscale inclination (i.e., a wire pattern edge portion or an end of the defect portion), and a coordinate where the grayscale value is a threshold value is searched and determined to be the measurement position. The measurement location is set from multiple measurement positions determined from the grayscale profile. In this case, the measurement location is not a coordinate on the image, but is a position on the grayscale profile.

In the grayscale profile of the SEM image, there may be positions where the grayscale value is equal to the threshold value at both sides of the position of the portion where there is the grayscale inclination and where the grayscale value is the highest. In this case, which position is determined to be the measurement position may be determined from the measurement target included in the measurement recipe. For example, when the measurement target is a wire width, the position farther from the center coordinate of the measurement region is determined to be the measurement position, and when the measurement target is an inter-wire distance, the position closer to the center coordinate of the measurement region is determined to be the measurement position. In order to reduce the influence of the noise, the grayscale profile may be projected in a direction perpendicular to the measurement direction, and an arithmetic mean may be employed.

The setting method of the measurement recipe will be explained reference to FIG. 10.

As described above, the measurement recipe is set in advance for each defect type, and stored in the measurement recipe storage unit 112. FIG. 10 is a screen for setting a measurement recipe. Reference symbol 1001 shows defect types that can be classified in the defect classification processing S501. Reference symbol 1002 shows, for each defect type, values of information (measurement direction, measurement target, measurement method, and the like) required for setting a measurement location for a defect image. The direction means a measurement direction, and includes a direction parallel to or perpendicular to a wire, or horizontal and vertical directions of the image, or the like. The target means a measurement target, and includes a wire region width, a distance between wire regions, a defect size in an image horizontal direction, a defect size in an image vertical direction, a distance between a defect region and a wire region, and the like. The method means a measurement method, and includes an average value, the minimum value, the maximum value, an intermediate value, and the like of the measurement target. Each item can be changed into any given value with a combo box and the like. Reference symbol 1003 displays, for each defect type, values of information required for setting a measurement location for a reference image. The measurement recipe may include items other than the measurement direction, the measurement target, and the measurement method as long as it is information required for the measurement processing. Although not shown in the drawing, the defect evaluation value calculation expression explained above is also configured so that it can be set for each defect type. Reference symbol 1004 denotes a button for adding an item of a defect type, and reference symbol 1005 denotes a button for deleting a defect type. In reference symbol 1001, information about a defect type used in the classification in the defect image classification processing S501 may be read and displayed.

Figure 11:
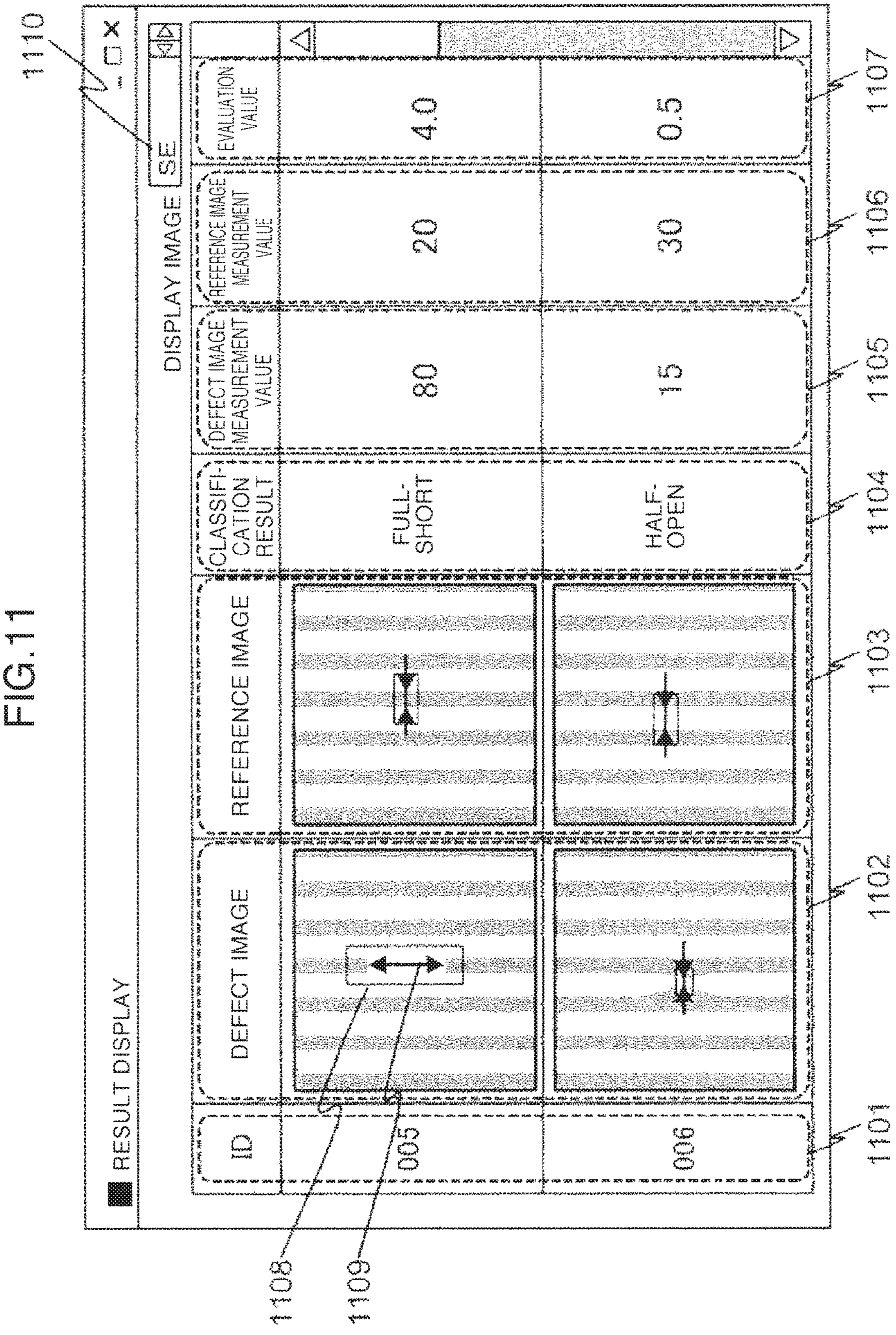
FIG. 11 is a figure illustrating an example of a screen input/output display for displaying a quantification result according to an embodiment of the present invention.

A display of a quantification result will be explained with reference to FIG. 11. FIG. 11 is a display screen illustrating a processing result in the defect quantification processing S304. Displayed on the screen are a defect ID 1101, a defect image 1102, a reference image 1103, a classification result 1104 in the defect image classification processing S501, a measurement value 1105 in the defect image measured in S503 and a measurement value 1106 in a reference image, and an evaluation value 1107 calculated from a defect image and a reference image in S504. A measurement region 1108 and a measurement location 1109 are displayed on the defect image 1102 and the reference image 1103. In a case where there are multiple measurement locations for a single measurement region, only a representing measurement location may be displayed. There may not be only one measurement region 1108 and only one measurement location 1109 in the defect image and the reference image, and in a case where there are multiple measurement regions 1108 and measurement locations 1109, the multiple measurement regions 1108 and measurement locations 1109 may be displayed. In a case where there are multiple defect image measurement values 1105, reference image measurement values 1106, and evaluation values 1107, all or some of the defect image measurement values 1105, reference image measurement values 1106, and evaluation values 1107 may be displayed on the screen. In a case where there are multiple measurement values, IDs may be given to the measurement values, and the corresponding IDs may be displayed in proximity to the measurement region and the measurement location on the image, so that the measurement locations and the measurement regions can be associated with each other. Reference symbol 1110 is a combo box for selecting a type of an image displayed as the defect image 1102 and the reference image 1103.

According to the first embodiment explained above, an appropriate measurement location can be set on the defect image and the reference image on the basis of the type of the defect, and the evaluation value is calculated by using the obtained measurement value, so that information useful for yield management can be presented to the user.

Second Embodiment

In the second embodiment, a defect quantification method for calculating the measurement value of a defect image and a reference image on the basis of multiple stored measurement recipes, selecting a measurement value used for evaluation value calculation on the basis of a classification result of a defect, and calculating the evaluation value will be explained.

The present embodiment is different from the first embodiment only in the device configuration (FIG. 1) and the quantification flow (FIG. 5), and except the above, the present embodiment includes a method, a device, and a screen input/output display similar to those of the first embodiment. Hereinafter, only portions different from the first embodiment will be explained.

Figure 12:
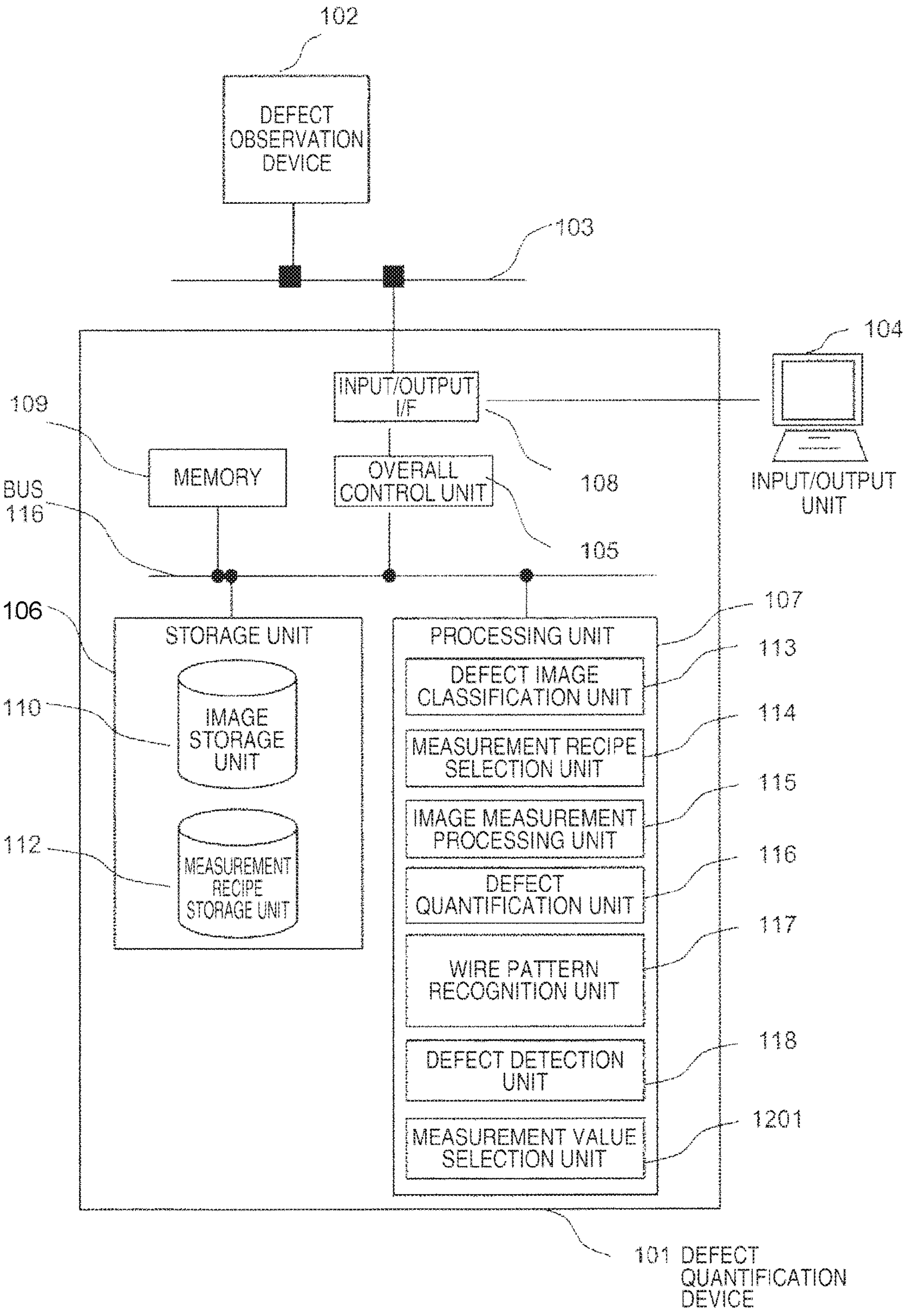
FIG. 12 is a configuration diagram illustrating a defect quantification device according to an embodiment of the present invention.

A device configuration according to the present embodiment is shown in FIG. 12. In addition to the device configuration of the first embodiment explained in FIG. 1, a measurement value selection unit 1201 for selecting a measurement value used for quantification is provided in the processing unit 107.

Figure 13:
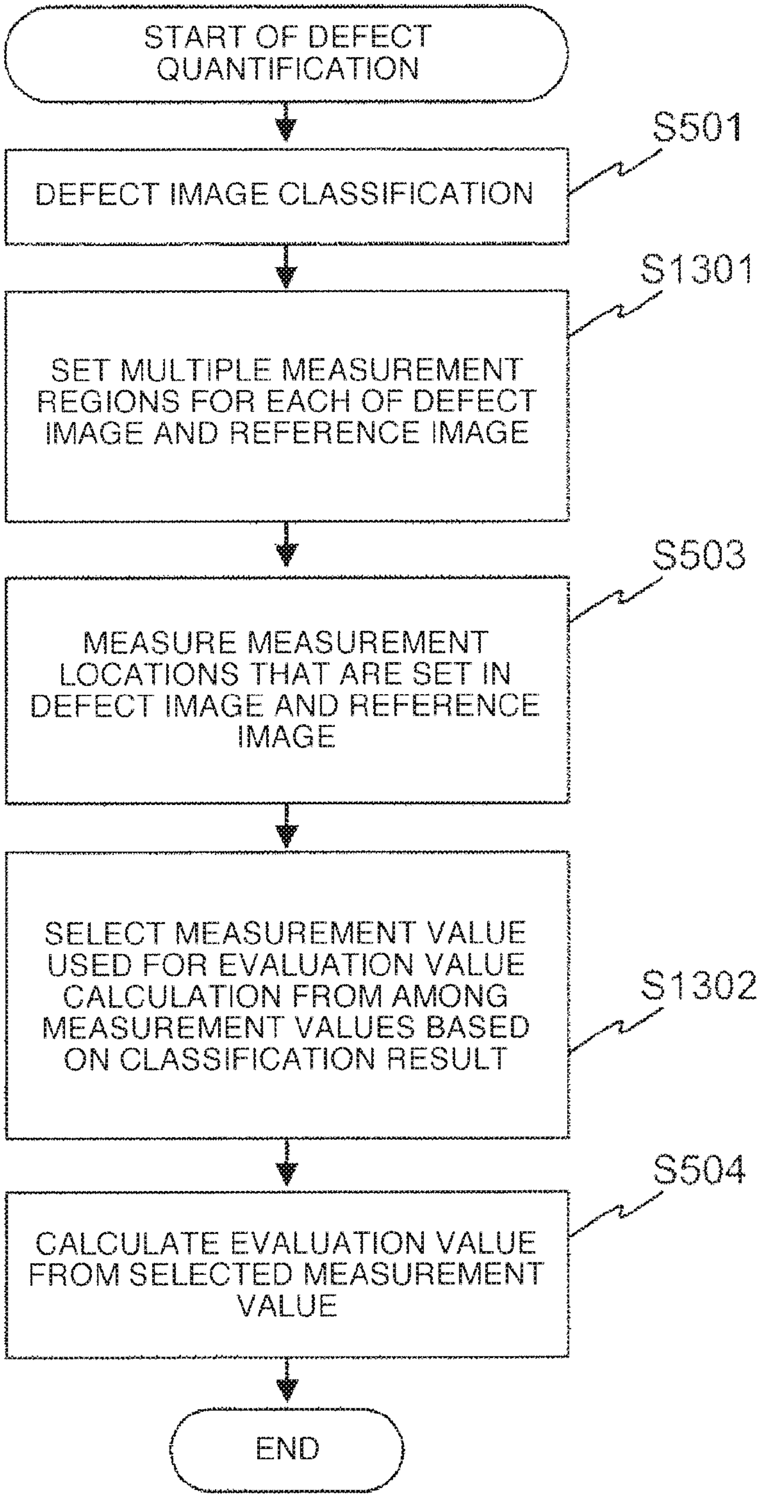
FIG. 13 is a flow diagram illustrating a procedure of defect quantification processing according to an embodiment of the present invention.

Subsequently, a procedure of quantification will be explained with reference to FIG. 13. FIG. 13 is an example of a quantification flow according to the present embodiment. In the present embodiment, first, the defect image classification processing is executed (S502), and multiple measurement regions are set for each of a defect image and a reference image (S1301). S1301 is executed by the image measurement processing unit 115, and the setting is made on the basis of all or some of the measurement recipes stored in the measurement recipe storage unit 112. The setting of the measurement locations may be performed by using a method similar to that of the first embodiment.

Subsequently, in accordance with a method similar to the first embodiment, measurement locations that are set in the defect image and the reference image are measured (S503).

On the basis of the classification result of S501, a measurement value used for evaluation value calculation is selected from among the measurement values obtained in S503 (S1302). S1302 is executed by the measurement value selection unit 1201. In the selection of the measurement value, for example, a measurement recipe associated with the classified defect type may be read from the measurement recipe storage unit 112, and the measurement value of the measurement location matching the setting of the measurement recipe may be selected. When the measurement location is set and measured, the defect type information corresponding to the used measurement recipe may also be stored together with the measurement value, and a measurement value may be selected from information about the defect type.

Finally, in accordance, with a method similar to the first embodiment, the evaluation value calculation is performed from the selected measurement value. It should be noted that the defect classification processing S501 may be performed, at any given point in time as long as it is before the measurement value selection processing S1302.

According to the above second embodiment, effects similar to those of the first embodiment can be obtained, and an appropriate measurement location can be set on the defect image and the reference image on the basis of the type of the defect, and the evaluation value is calculated by using the obtained measurement value, so that information useful for the yield management can be presented to the user.

Third Embodiment

In the third embodiment, a method for identifying a location where defect observation is to be performed on a wafer of the same process on the basis of an evaluation value of a defect quantified according to the first or second embodiment and executing defect observation will be described. It should be noted that the present embodiment will be explained on the basis of the first embodiment, but even if the evaluation value is obtained according to the second embodiment, the present embodiment can be executed.

The present embodiment is different from the first embodiment only in the device configuration (FIG. 1) and the flow of the defect observation (FIG. 3), and except the above, the present embodiment includes a method, a device, and, a screen input/output display similar to those of the first embodiment.

Figure 14:
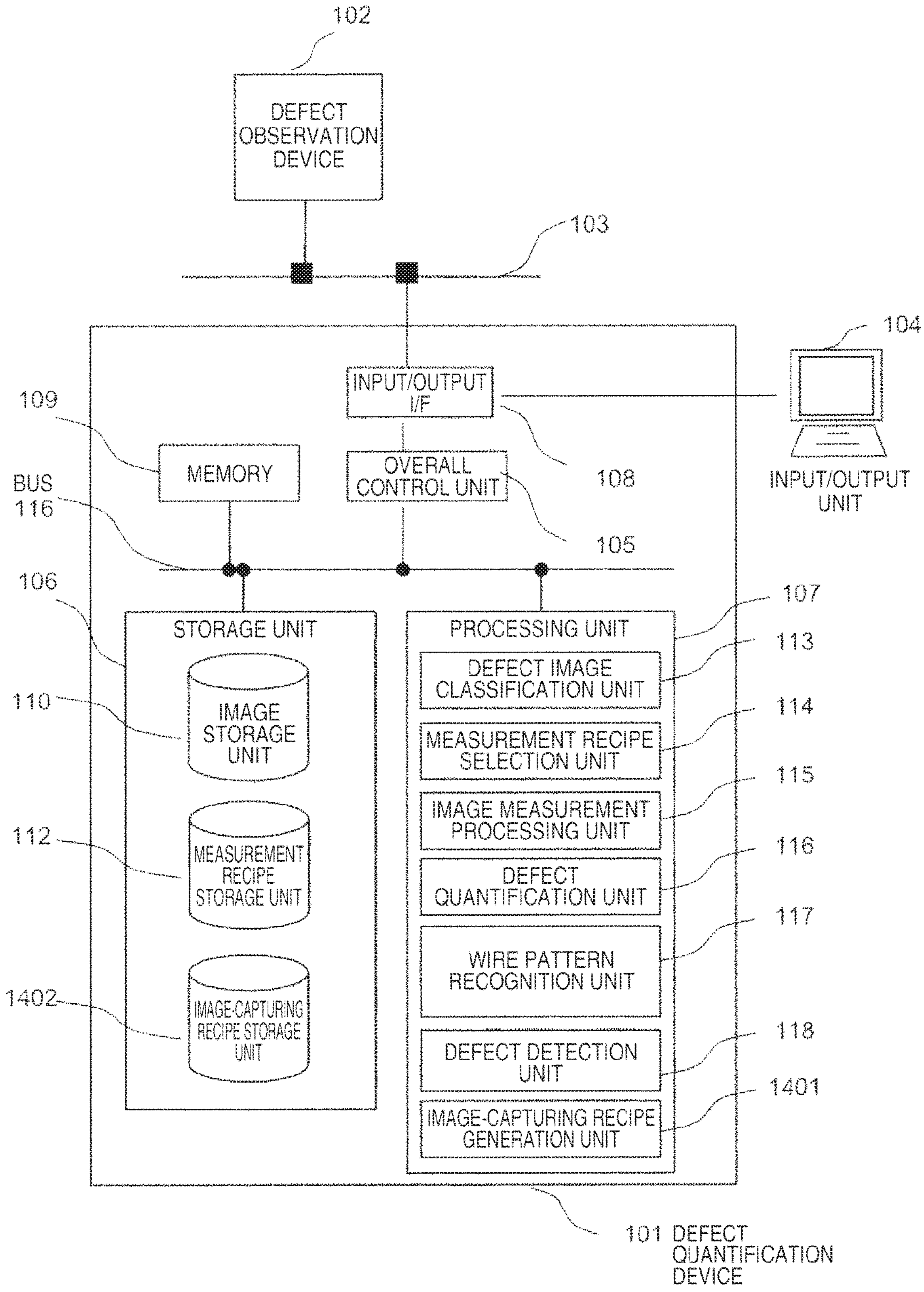
FIG. 14 is a configuration diagram illustrating a defect quantification device according to an embodiment of the present invention.

A device configuration according to the present embodiment is shown in FIG. 14. In addition to the device configuration of the first embodiment explained in FIG. 1 an image-capturing recipe generation unit 1401 for capturing an image of a wafer of the same process as the wafer for which the defect evaluation value has been calculated and an image-capturing recipe storage unit 1402 for storing the generated image-capturing recipe are provided in the processing unit 107. In this case, the image-capturing recipe means information having a coordinate of the observation position on the wafer where the defect observation is to be performed, an observation magnification rate at that position, an image-capturing condition of an electron optical system, and the like.

Figure 15:
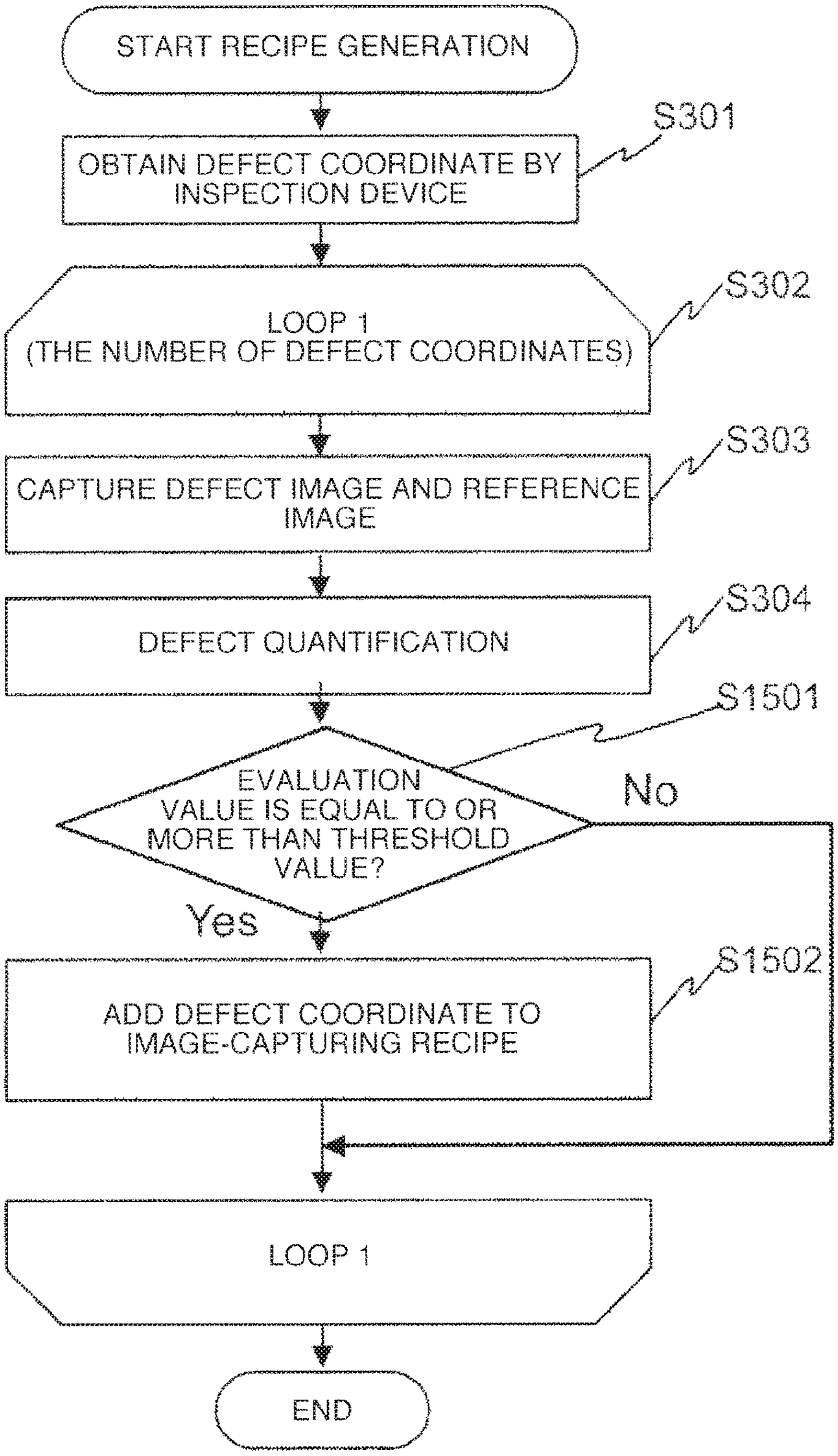
FIG. 15 is a flow diagram illustrating a procedure of an image-capturing recipe generation according to an embodiment of the present invention.

Subsequently, a procedure of image-capturing recipe generation will be explained with reference to FIG. 15. FIG. 15 is an example of an image-capturing recipe generation according to the present embodiment. In S301 to S304, processing similar to that in the first embodiment is performed. Subsequently, the evaluation value obtained in S304 and a threshold value are compared (S1501). It is assumed that the threshold value is set in advance by the user. In a case where there are multiple evaluation values, a threshold value corresponding to each of the evaluation values is prepared.

In a case where the evaluation value is equal to or more than the threshold value, the quantified coordinate of the defect on the water is added to the image-capturing recipe as an image-capturing target (S1502). The condition for adding the defect coordinate to the image-capturing recipe is not limited to the condition that the evaluation value is equal to or more than the threshold value. The condition may be any given condition, and it is assumed that this condition is set before the flow of FIG. 15 is executed.

According to the above third embodiment, the defect coordinate is added to the image-capturing recipe on the basis of the evaluation value of the defect, which enables fixed-point observation of the defect occurrence position determined to be an important defect on the basis of the defect evaluation value, and the defect observation position effective for the yield management can be obtained efficiently. When the wafer defect observation is performed with the image-capturing recipe for the fixed-point observation generated as described above, an occurrence tendency of the important defect can be monitored.

The present invention has been hereinabove explained on the basis of the embodiments in a specific manner, but the present invention is not limited to the above embodiments, and it is to be understood that the present invention can be changed in various manners without deviating from the gist thereof.

REFERENCE SIGNS LIST

101 . . . defect quantification device, 102 . . . defect observation device, 103 . . . communication means, 104 . . . input/output unit, 105 . . . overall control unit, 106 . . . storage unit, 107 . . . processing unit, 108 . . . input/output I/F, 109 . . . memory, 110 . . . image storage unit, 111 . . . bus, 112 . . . measurement recipe storage unit, 113 . . . defect image classification unit, 114 . . . measurement recipe selection unit, 115 . . . image measurement processing unit, 116 . . . defect quantification unit, 117 . . . wire pattern recognition unit, 118 . . . defect detection unit

The invention claimed is:

1. A defect quantification method for calculating an evaluation value of a defect on a semiconductor wafer, the defect quantification method comprising:

classifying a defect image using a defect image processor;

setting a measurement region and a measurement location for each of the defect image and a reference image corresponding to the defect image based on a defect image classification result; and calculating an evaluation value of a defect, using the processor, by using each measurement value obtained from the measurement location of the defect image and the reference image such that said evaluation value quantifies a degree of said defect based on a distance dimension difference of the defect in the defect image in comparison with a reference distance dimension in the reference image, wherein said degree of said defect is at least one of a fluctuation in a pair of adjacent wire patterns in a width of roughness of said distance dimension of the defect in the defect image with respect to a reference wire width dimension in the reference image, wherein said evaluation value is obtained by dividing a measured maximum width of a fluctuation of said roughness by said wire width of the reference image;

a full-short defect in which a pair of adjacent wire patterns are completely shorted in a length distance dimension of the defect in the defect image with respect to a reference width distance between adjacent wires dimension in the reference image, wherein said evaluation value is obtained by dividing a measured shortest distance of a shorted portion by an interwire distance of the reference image, a half-short defect in which a pair of adjacent wire patterns are incompletely shorted in a width distance dimension of the defect in the defect image with respect to a reference width distance between wires dimension in the reference image, wherein said evaluation value is obtained by dividing (1 minus a measured shortest distance of an incompletely shorted portion) by an interwire distance of the reference image, a full-open defect in which a pair of adjacent wire patterns are completely cut off from each other in a length distance dimension of the defect in the defect image with respect to a reference wire width distance dimension in the reference image, wherein said evaluation value is obtained by dividing a measured shortest distance of a completely cut off portion by the wire width distance of the reference image;

a half-open defect in which a pair of adjacent wire patterns are incompletely cut off from each other in a width distance dimension of the defect in the defect image with respect to a reference wire width distance dimension in the reference image, wherein said evaluation value is obtained by dividing (1 minus a measured shortest distance of an incompletely cut off portion) by an interwire distance of the reference image; and a hole defect in which a hole diameter is reduced or expanded in a hole diameter distance dimension of the defect in the defect image with respect to a reference hole diameter distance dimension in the reference image, wherein said evaluation value is obtained by dividing (a measured hole diameter of the defect minus said reference hole diameter) by said reference hole diameter.

2. The defect quantification method according to claim 1, wherein the step of setting the measurement region and the measurement location in the defect image and reference image further comprises:

selecting a measurement recipe on the basis of the defect image classification result; and setting the measurement region and the measurement location on the basis of the measurement recipe.

3. The defect quantification method according to claim 2, wherein the measurement recipe is registered for each defect type obtained from the defect image classification result.

4. The defect quantification method according to claim 2, wherein the measurement recipe includes a measurement direction, a measurement target, and a measurement method for each of the defect image and the reference image.

5. The defect quantification method according to claim 1, further comprising:

adding, to an image-capturing recipe, an image-capturing position coordinate of a defect for which an evaluation value is obtained, on the basis of the evaluation value of the defect.

6. The defect quantification method according to claim 1, wherein the step of classifying the defect image is performed by using a defect region detected by comparing the defect image and the reference image and a wire pattern region extracted from the reference image.

7. The defect quantification method according to claim 1, wherein a target for which an evaluation value of the defect is calculated is a pattern defect.

8. A defect quantification device for calculating an evaluation value of a defect on a semiconductor wafer, comprising:

a defect image processor configured to classify a defect image;

an image measurement processor configured to set a measurement region and a measurement location for a defect image and a reference image based on a classification result of the defect image classification, and to perform measurement processing in accordance with the measurement region and the measurement location that have been set; and a defect quantifier configured to calculate an evaluation value of a defect by using a measurement value obtained from the measurement location of the defect image and the reference image such that said evaluation value quantifies a degree of said defect based on a distance dimension difference of the defect in the defect image in comparison with a reference distance dimension in the reference image, wherein said degree of said defect is at least one of a fluctuation in a pair of adjacent wire patterns in a width of roughness of said distance dimension of the defect in the defect image with respect to a reference wire width dimension in the reference image, wherein said evaluation value is obtained by dividing a measured maximum width of a fluctuation of said roughness by said wire width of the reference image, a full-short defect in which a pair of adjacent wire patterns are completely shorted in a length distance dimension of the defect in the defect image with respect to a reference width distance between adjacent wires dimension in the reference image, wherein said evaluation value is obtained by dividing a measured shortest distance of a shorted portion by an interwire distance of the reference image;

a half-short defect in which a pair of adjacent wire patterns are incompletely shorted in a width distance dimension of the defect in the defect image with respect to a reference width distance between wires dimension in the reference image, wherein said evaluation value is obtained by dividing (1 minus a measured shortest distance of an incompletely shorted portion) by an interwire distance of the reference image, a full-open defect in which a pair of adjacent wire patterns are completely cut off from each other in a length distance dimension of the defect in the defect image with respect to a reference wire width distance dimension in the reference image, wherein said evaluation value is obtained by dividing a measured shortest distance of a completely cut off portion by the wire width distance of the reference image;

a half-open defect in which a pair of adjacent wire patterns are incompletely cut off from each other in a width distance dimension of the defect in the defect image with respect to a reference wire width distance dimension in the reference image, wherein said evaluation value is obtained by dividing (1 minus a measured shortest distance of an incompletely cut off portion) by an interwire distance of the reference image; and a hole defect in which a hole diameter is reduced or expanded in a hole diameter distance dimension of the defect in the defect image with respect to a reference hole diameter distance dimension in the reference image, wherein said evaluation value is obtained by dividing (a measured hole diameter of the defect minus said reference hole diameter) by said reference hole diameter.

9. The defect quantification device according to claim 8, further comprising:

a measurement recipe storage device for storing a measurement recipe; and a measurement recipe selector configured to select the measurement recipe based on the classification result of the defect image classification, wherein the image measurement processor performs measurement processing based on the measurement region and the measurement location for the defect image and the reference image based on the measurement recipe selected by the measurement recipe selector.

10. The defect quantification device according to claim 9, wherein the measurement recipe stored in the measurement recipe storage device exists for each defect type.

11. The defect quantification device according to claim 9, wherein the measurement recipe includes a measurement direction, a measurement target, and a measurement method for each of the defect image and the reference image.

12. The defect quantification device according to claim 8, further comprising:

an image-capturing recipe storage device which stores an image-capturing recipe; and an image-capturing recipe generator configured to add, to the image-capturing recipe, a coordinate where a defect image has been captured, based on the evaluation value.

13. The defect quantification device according to claim 8, further comprising:

a defect detector configured to detect a defect region by comparing the defect image and the reference image; and a wire pattern recognizer configured to extract a wire pattern region from the reference image, wherein the processor is configured to perform classification by using the defect region and the wire pattern region.

14. The defect quantification device according to claim 8, wherein a target for which the evaluation value is calculated is a pattern defect.

15. The defect quantification device according to claim 8, wherein the defect quantifier calculates the evaluation value by using a ratio between a measurement value of the defect image and a measurement value of the reference image.

16. The defect quantification device according to claim 8, further comprising a measurement value selector configured to select the measurement value for the defect image and the reference image based on the image classification result.

17. A defect evaluation value display device comprising:

a computer display screen;

the defect evaluation value display device being configured to display an evaluation value of a defect on a semiconductor wafer, wherein the defect evaluation value display device is further configured to display:

at least one of a defect image and a reference image;

a measurement region or a measurement location according to a type of a defect displayed on at least one of a defect image and a reference image; and a defect evaluation value, and wherein said defect evaluation value quantifies a degree of said defect based on a distance dimension difference of the defect in the defect image in comparison with a reference distance dimension in the reference image, wherein said degree of said defect is at least one of a fluctuation in a pair of adjacent wire patterns in a width of roughness of said distance dimension of the defect in the defect image with respect to a reference wire width dimension in the reference image, wherein said evaluation value is obtained by dividing a measured maximum width of a fluctuation of said roughness by said wire width of the reference image, a full-short defect in which a pair of adjacent wire patterns are completely shorted in a length distance dimension of the defect in the defect image with respect to a reference width distance between adjacent wires dimension in the reference image, wherein said evaluation value is obtained by dividing a measured shortest distance of a shorted portion by an interwire distance of the reference image;

a half-short defect in which a pair of adjacent wire patterns are incompletely shorted in a width distance dimension of the defect in the defect image with respect to a reference width distance between wires dimension in the reference image, wherein said evaluation value is obtained by dividing (1 minus a measured shortest distance of an incompletely shorted portion) by an interwire distance of the reference image;

a full-open defect in which a pair of adjacent wire patterns are completely cut off from each other in a length distance dimension of the defect in the defect image with respect to a reference wire width distance dimension in the reference image, wherein said evaluation value is obtained by dividing a measured shortest distance of a completely cut off portion by the wire width distance of the reference image;

a half-open defect in which a pair of adjacent wire patterns are incompletely cut off from each other in a width distance dimension of the defect in the defect image with respect to a reference wire width distance dimension in the reference image, wherein said evaluation value is obtained by dividing (1 minus a measured shortest distance of an incompletely cut off portion) by an interwire distance of the reference image; and a hole defect in which a hole diameter is reduced or expanded in a hole diameter distance dimension of the defect in the defect image with respect to a reference hole diameter distance dimension in the reference image, wherein said evaluation value is obtained by dividing (a measured hole diameter of the defect minus said reference hole diameter) by said reference hole diameter.

* * * * *